United States Patent
Draper et al.

(10) Patent No.: US 7,265,334 B2
(45) Date of Patent: Sep. 4, 2007

(54) LASER POWER CONTROL WITH AUTOMATIC COMPENSATION

(75) Inventors: Daniel Draper, Portland, OR (US); Maurice M. Reintjes, Beaverton, OR (US); Gilberto I. Sada, Irvine, CA (US); Keith R. Jones, Irvine, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 49 days.

(21) Appl. No.: 11/244,484

(22) Filed: Oct. 5, 2005

(65) Prior Publication Data

US 2006/0108501 A1 May 25, 2006

Related U.S. Application Data

(63) Continuation-in-part of application No. 11/134,715, filed on May 20, 2005, which is a continuation-in-part of application No. 10/993,525, filed on Nov. 19, 2004.

(51) Int. Cl.
*H01J 40/14* (2006.01)
(52) U.S. Cl. .............................. 250/214 R; 250/214 C
(58) Field of Classification Search ............... 250/205, 250/214 R, 201.1, 214 C; 372/29.011, 29.014, 372/29.021, 31, 32, 34
See application file for complete search history.

(56) References Cited

U.S. PATENT DOCUMENTS

| 5,019,769 | A | 5/1991 | Levinson |
| 5,383,208 | A | 1/1995 | Queniat et al. |
| 5,396,059 | A | 3/1995 | Yeates |
| 5,594,748 | A | 1/1997 | Jabr |
| 5,812,572 | A | 9/1998 | King et al. |
| 6,556,601 | B2 * | 4/2003 | Nagata ................. 372/29.011 |

* cited by examiner

*Primary Examiner*—Que T Le
(74) *Attorney, Agent, or Firm*—Weide & Miller, Ltd.

(57) ABSTRACT

A method and apparatus is disclosed for optic signal power control to maintain a desired or optimum optic signal power level. During start-up, a target value from memory may be utilized to control one or more power levels of an optic signal. There may comprise 2 or more different power levels for the optic signal. During operation, target values may continue to be utilized or an open loop or closed loop control system may be utilized. Compensation may occur for both additive noise/distortion and multiplicative noise/distortion. The compensation for one power level may be expanded or extrapolated to compensate for additive noise/distortion and multiplicative noise/distortion that affect other power levels.

20 Claims, 21 Drawing Sheets

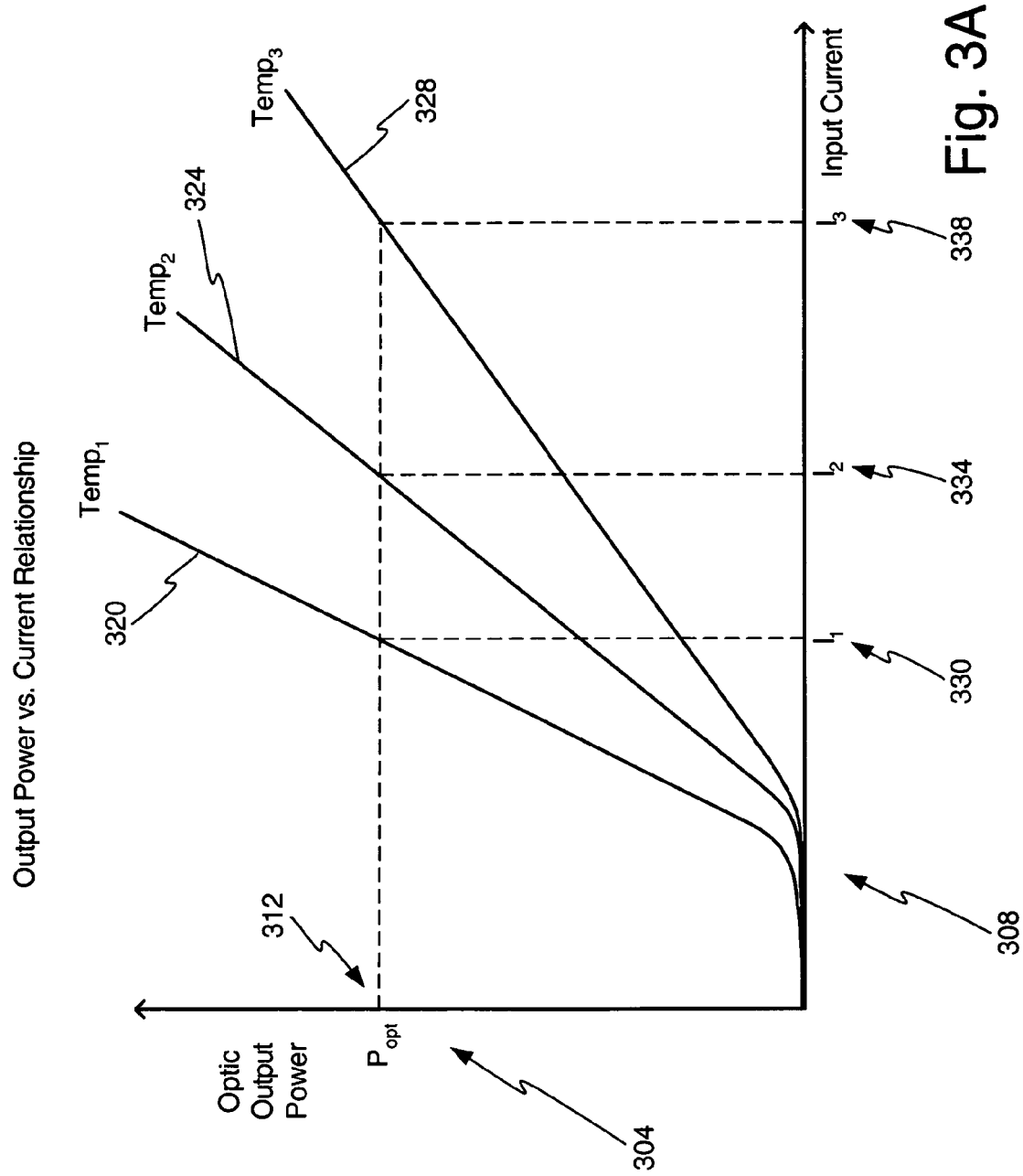

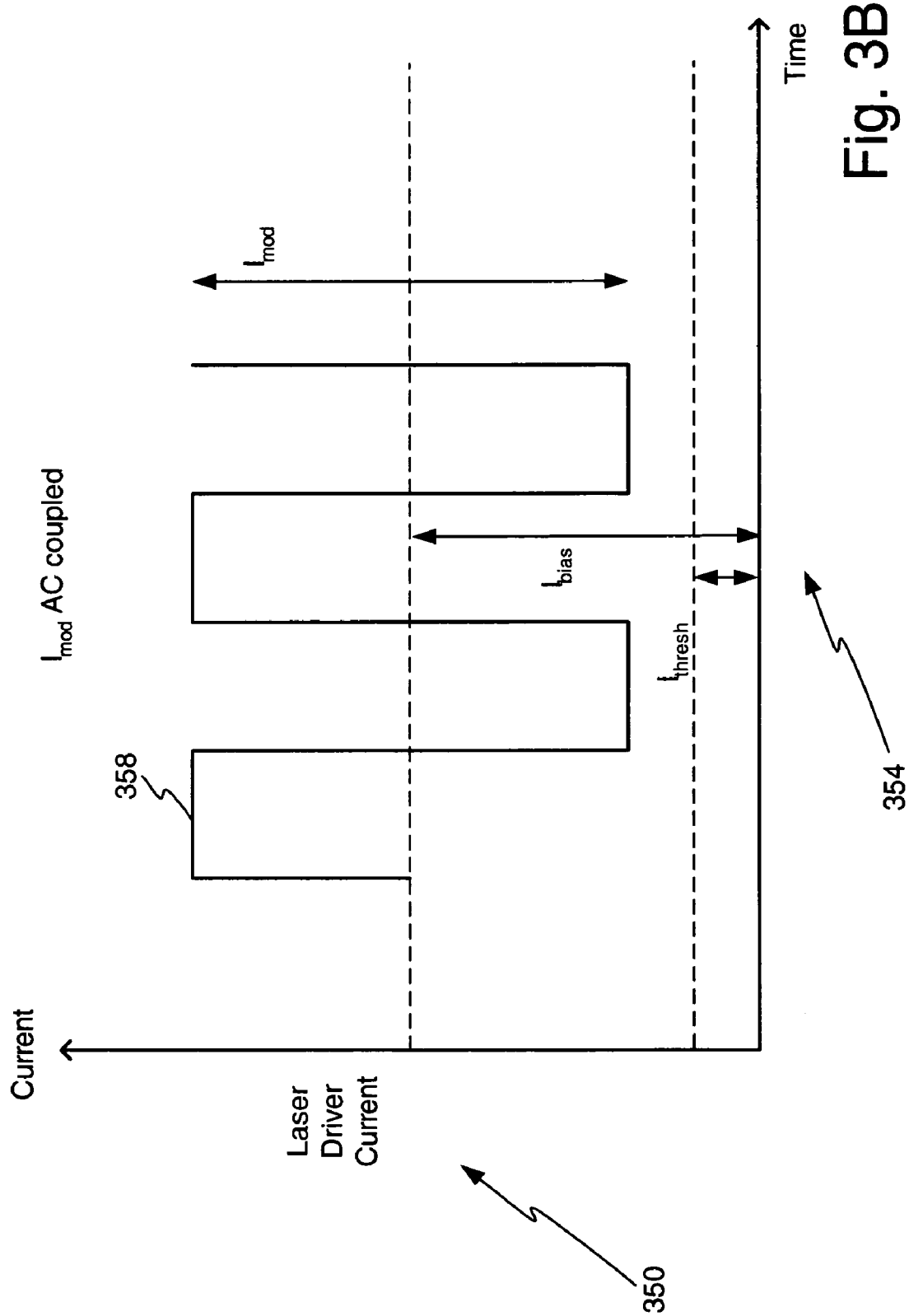

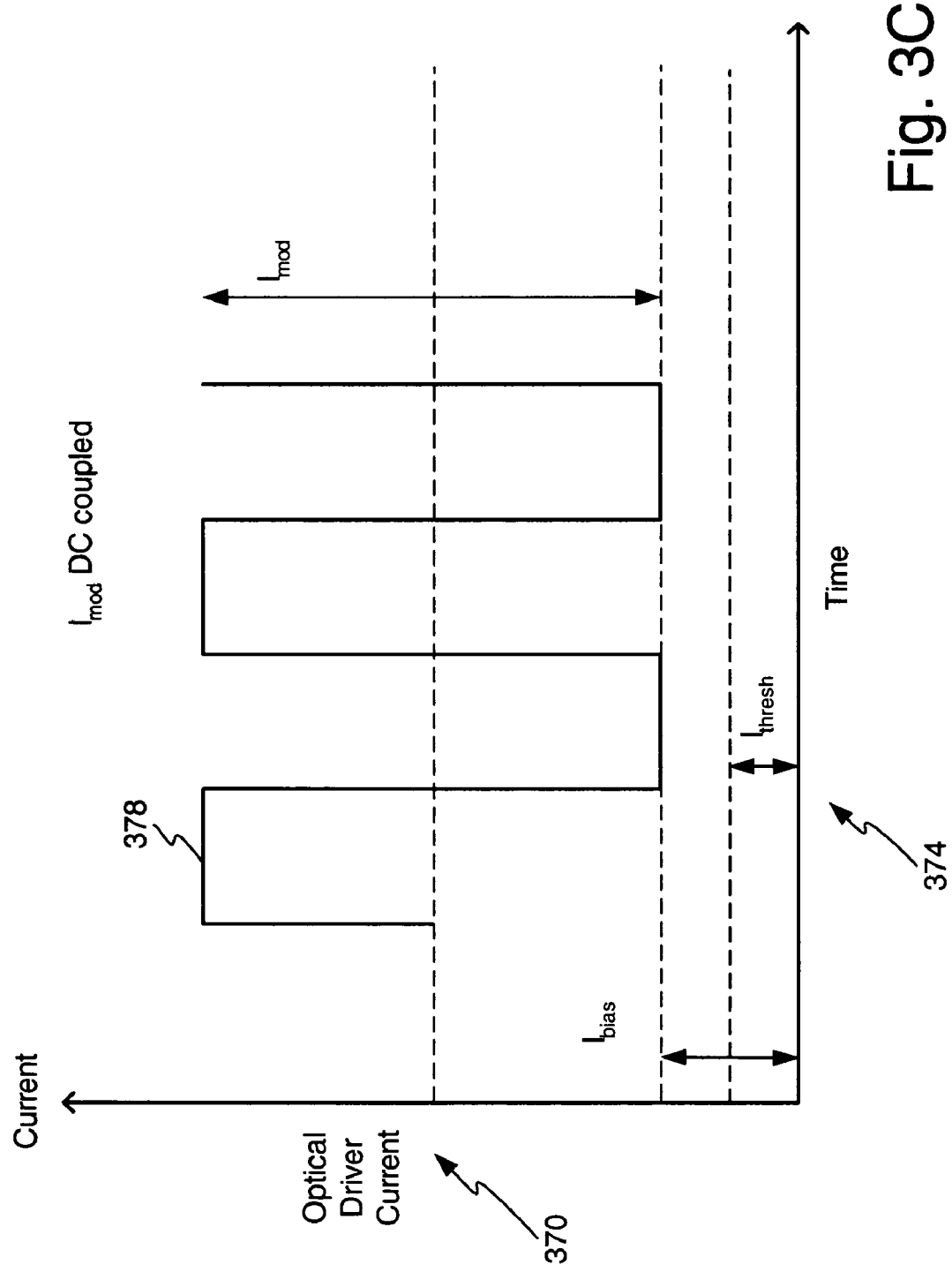

LASER POWER CONTROL WITH AUTOMATIC COMPENSATION

1. PRIOR APPLICATION DATA

This application is a continuation-in-part of U.S. application Ser. No. 11/134,715 filed on May 20, 2005, which is a continuation-in-part of U.S. application Ser. No. 10/993,525 filed on Nov. 19, 2004.

2. FIELD OF THE INVENTION

The invention relates to optical signal generator output control and, in particular, to a method and apparatus for controlling optical signal generator output based on environmental or other factors.

2. RELATED ART

Many modern electronic devices and systems utilize optical signals to achieve desired operation. Examples of such devices include fiber optic communication systems, optical media read and write devices in computer and home entertainment systems, such as CD players and DVD players, and other devices that utilize a laser, photodiode, or other optical device.

As can be appreciated, these devices require highly precise operation and, with each generation of a product, a higher level of accuracy may be required to meet increasing demands in speed, storage capability, or data rate. Adding to the operational requirements, the environments in which such devices are required to operate are also subject to great variation. Optic devices, such as a laser transmitter or photodiodes have moved out of the laboratory and into everyday environments. Examples include optical communication systems, which may operate in remote locations or small and crowded equipment rooms and computer rooms, optical media readers found in automobiles and home environments, as well as optical systems in remote industrial applications which are remote and difficult to reach.

The varying environmental aspects of these varying locations present numerous hurdles for accurate device operation. One such hurdle is that device operation may be affected by temperature variation. Thus, as the environmental temperature changes, so do device operational parameters. Thus, the temperature change may cause the device to not meet specification and result in errors, reduced payload data throughput, or both. In some instances, the device may become inoperable. As can be appreciated, this is a serious drawback to device operation.

Other factors may affect the device operation in a similar manner. One such factor is the age of the device or the age of the components in the device. Over time, component behavior may vary and this variance my result in operation that does not meet specification.

The method and apparatus disclosed herein overcomes these drawbacks of the prior art and provides additional advantages as will be appreciated after reading the specification which follows in connection with the figures.

SUMMARY

To overcome the drawbacks of the prior art, a method and apparatus is disclosed for optic signal power control to maintain a desired or optimum optic signal power level. During start-up, a default or target value from memory may be utilized to bias or otherwise control operation of an optic signal generator or driver. During operation, pre-stored values may continue to be utilized or an open loop or closed loop control system may be utilized. An open loop control system may incorporate a temperature module or a timer module to account for changes in environment or changes due to aging that may undesirably affect system operation. A closed loop control system may incorporate one or more feedback loops that generate a compensation value to account for detected changes. It is further contemplated that the photodetector current or optic signal generator current may be monitored, such as in a closed loop feedback system to control the power level of the optic signal. In one configuration, one or more peak values of the actual optic signal, or a portion thereof, are detected and processed to generate the compensation signal.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis is instead placed upon illustrating the principles of the invention. In the figures, like reference numerals designate corresponding parts throughout the different views.

FIG. 3A illustrates an example plot of slope efficiencies for various temperatures for an exemplary optical generator.

FIG. 3B illustrates an example plot of AC coupled driver current.

FIG. 3C illustrates an example plot of DC coupled driver current.

DETAILED DESCRIPTION

The method and apparatus disclosed herein overcomes the drawbacks of the prior art and provides additional advantages, features, and benefits. In general, an optical communication system is described herein as an example environment for the method and apparatus described herein. Although described in connection with an optical communication system, other environments that would benefit from the methods and apparatus described herein, such as, but are not limited to, optical media drives, laser surgery equipment, laser welding, free-space optical links and any other environment that utilizes an optical device.

Figure 1:
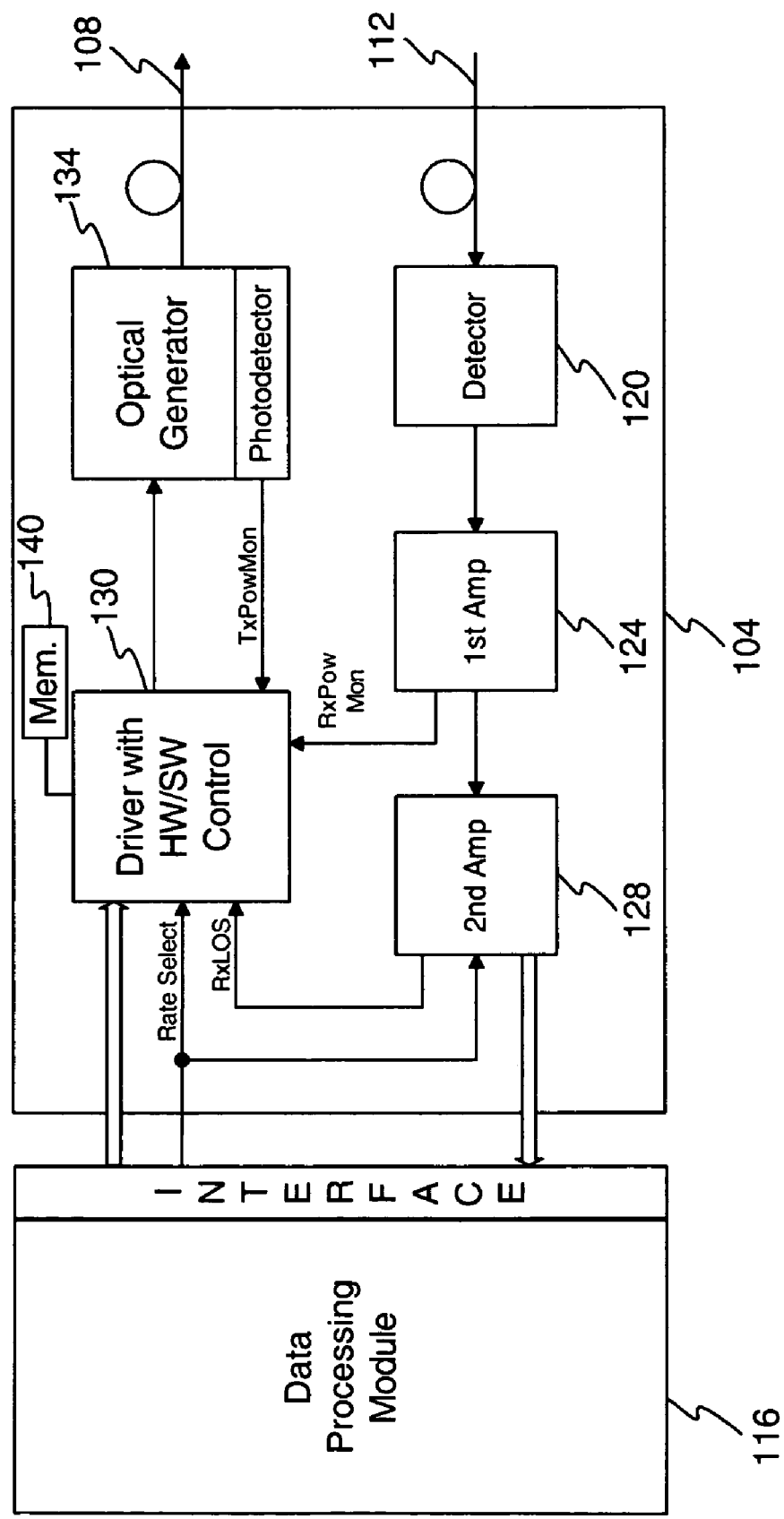
FIG. 1 illustrates a block diagram of an exemplary control module for an optical communication system.

Turning now to FIG. 1, a block diagram of an example module for an optical communication system is shown. The configuration shown in this Figure, and the other Figures provided herein, is but one possible configuration and, as such, it is contemplated that one of ordinary skill in the art may arrive at a different embodiment, configuration, or method of operation without departing from the scope of the claims. As shown, a transceiver with laser control 104 connects to one or more optic fibers, namely, an RX fiber 112 and a TX fiber 108. It is contemplated that the module 104 may comprise a single or multi-fiber module, and/or one which may have one or more wavelengths operating at the same time. The transceiver 104 also connects to a data processing module 116 having an interface. In this example embodiment, the processing module or interface 116 is configured to process the data prior to or after passing through the transceiver 104. When configured as a processing module 116, the module may be configured to frame/unframe, scramble/descramble, encode/decode, and/or to serialize/de-serialize data going through the interface. In addition, processing module 116 may at the same time decode LFSC (Low Frequency Side Channel) data. The interface may be configured to receive data from or provide data to one or more downstream processing modules or software layers.

In this example embodiment, the transceiver 104 comprises a detector 120 configured with an output that connects to a first amplifier 124, which in turn is configured with an output that connects to a second amplifier 128. The output of the second amplifier 128 connects to the processing module or interface 116.

In this example embodiment, the detector 120 comprises any type of optical detector configured to detect and convert an optical signal into an electrical signal. The first amplifier 124 may comprise a trans-impedance amplifier configured to convert a current magnitude to a variable voltage signal. The second amplifier 128 may comprise a limiting amplifier configured to accurately amplify the signal from the first amplifier, and frequently generates an industry-wide acknowledged level, for example: PECL, ECL, CML, PCML, LVDS and so forth 104.

With regard to the transmitter aspects of the transceiver 104, a Driver with HW/SW control 130 receives an input from the processing module 116 intended for transmission on the optical fiber 108. The Driver with HW/SW control 130 may perform one or more operations as described herein or analyze the signal while passing the signal to the optical signal generator 134. In this case, terms HW and SW in HW/SW control implies the use of either software or firmware. The optical signal generator may comprise any device configured to generate an optical signal. The Driver with HW/SW control 130 may optionally connect to one or more external or internal memory modules 140.

The Driver with HW/SW control 130 is configured in conjunction with the other components of a communication system, to perform numerous tasks to overcome the drawbacks of the prior art. In one embodiment, the Driver with HW/SW control 130 may be configured to monitor the power level or other aspects of the optical output signal and based on this monitoring, create a control signal that maintains optimal or desired power level output for the optic signal generated by the optic signal generator. In one embodiment, the Driver with HW/SW control 130 may be configured to process a timer or counter signal that relates the age or operational life of the generator 134 to the control signal value. In one embodiment, the Driver with HW/SW control 130 may be configured to monitor the extinction ratio or a low frequency signal channel signal and based on this monitoring modify the control signal. In one embodiment, the Driver with HW/SW control 130 may be configured to process a temperature value signal that relates the temperature of the generator 134 to the control signal value.

Figure 2:
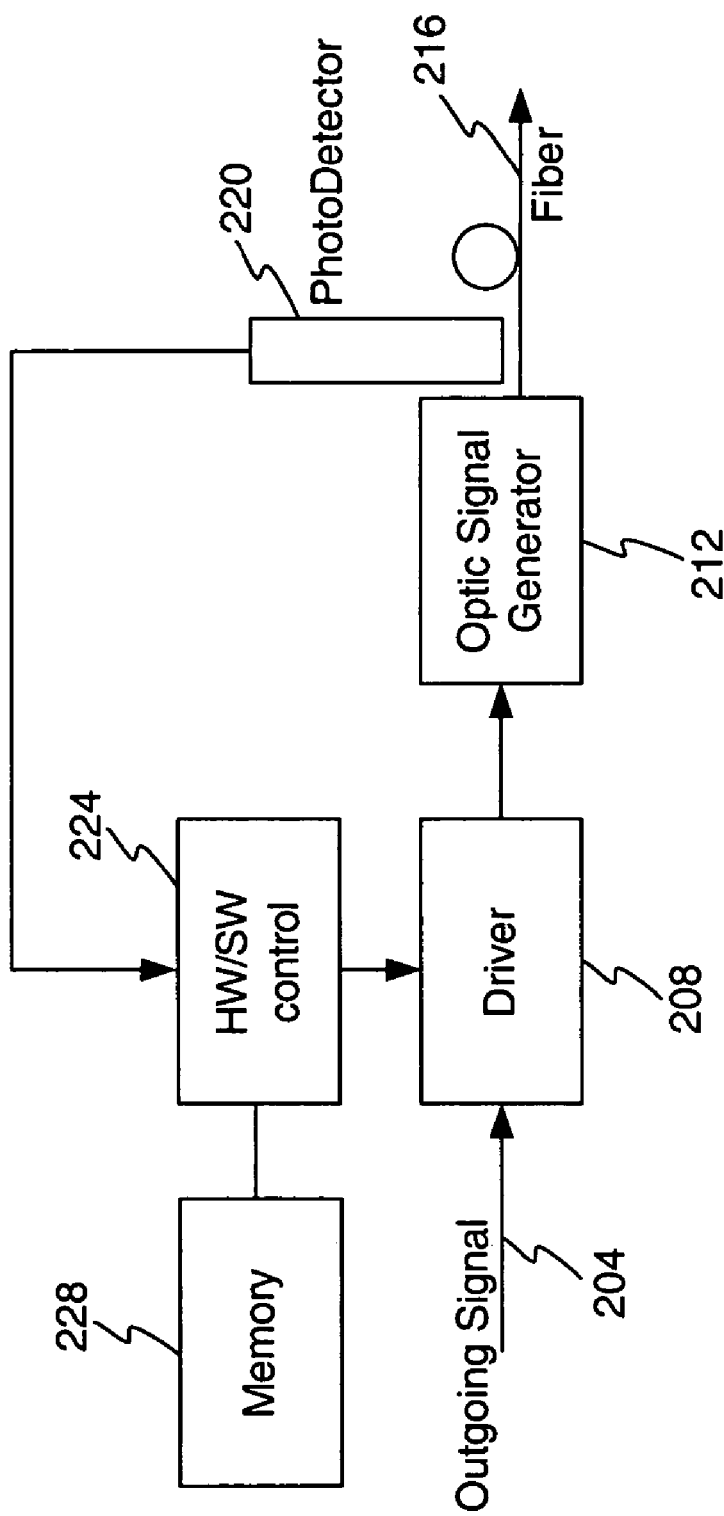
FIG. 2 illustrates a block diagram of an example embodiment of an optical signal power monitor and control system.

FIG. 2 illustrates a block diagram of an example embodiment of an optical signal power monitor and control system. As shown, an input 204 to the system provides an outgoing signal to an optical driver 208, which may comprise one or more devices configured to accurately drive an optic signal generator 212 as shown. The driver may comprise one or more amplifiers, current sources, voltage sources, peak detectors, comparators, as well as state machines used to control some or all of the aforementioned or any other device capable of processing or amplifying an outgoing signal into a signal capable of driving an optical signal generator 212. The optic signal generator 212 may comprise any type device capable of generating an optic signal in response to an electrical input. The optic signal generator 212 may comprise, but is not limited to, a laser, light-emitting diode, vertical-cavity-surface-emitting laser, or any electronic light emitting device. The output of the optic signal generator 212 is provided to one or more optic channels, such as an optic fiber 216.

A detector 220 is configured as part of the output structure or in some way associated with the optic signal generator 212 and/or fiber 216. The detector 220 is configured to detect the power level of the optic signal generated or output from the generator 212, the signal on the fiber 216, or both. The detector 212 may comprise, but is not limited to, a backscatter detector, CdS photocell, PIN photo detector, avalanche photo detector, or any other optical device that changes resistance or developed current with exposure to visible, infrared, or ultraviolet light.

The output of the detector 220, which comprises an electrical signal that is in some way representative of the optic signal, is provided to a HW/SW control 224, which may comprise hardware, software, or firmware control, control logic, comparator, or any other structure. The HW/SW control 224 processes or analyzes the signal, and in response to the processing or analyzing, generates a feedback or control signal. In this embodiment, the feedback or control signal is provided to the driver 208 to thereby optionally control the driver to adjust the power level or other aspects of the input to the generator 212. In this manner, the power level of the optic signal, on the fiber 216, is monitored, controlled, and maintained at an optimal state.

This method of operation and this apparatus overcomes the drawbacks of the prior art by accounting for any changes in the power of the optic signal regardless of the reason for the change. Unwanted changes in output power in the optic signal, regardless of the reason or cause, are undesirable and result in increased jitter and/or error rates, lower payload bit rates or both. In some instances, such changes in output power, if not monitored and mitigated, may disrupt communication system operation. This method and apparatus has the advantage over systems that estimate the power level of the optical signal or monitor the electrical signal because this method and apparatus monitors the actual power level of the optic signal. As a result, a more accurate reading is obtained, instead of an estimation, thereby resulting in a highly accurate and dynamic control loop that adapts, in real time, to changes in environment or device operation. It is further contemplated that monitoring functions may be implemented in the controller 224 to monitor impending failure or indicate future problems. This may be reported prior to device failure, thereby increasing circuit up time.

FIG. 3A illustrates an example plot of output power of a laser or optical power generator device for various temperatures for an exemplary optical generator. These plots are provided for the purpose of discussion and as examples, and as such, the claims that follow should not be limited in any way by these plots. As shown, the vertical axis 304 represents optic signal output power while the horizontal axis 308 represents input current to the optic signal generator. Three plots 320, 324, 328 are shown. $Temp_1$ plot 320 represents the output power characteristics at a first temperature, while plots 324, and 328 represent output power characteristics at a second temperature $Temp_2$ and third temperature $Temp_3$ respectively. Output power characteristics include changes to threshold current and/or slope efficiency.

In one embodiment, the optimal optic signal power level is defined at power level 312. As can be appreciated from FIG. 3A, for the optimal power level 312 at the first temperature, the signal generator requires an input current $I_1$ 330 to generate this optic signal power level. At the second temperature $Temp_2$, shown by the plot of input current to optic signal output power, the optimal optic power level is achieved with an input current $I_2$ 334, which is different than current $I_1$ associated with $Temp_1$. Moreover, at the third temperature $Temp_3$, an input current $I_3$ is required to establish the optimal optic signal power 312. Thus, as the threshold current and/or slope efficiency changes, due to temperature variation, aging, or other unanticipated factors, so too does the required input current 308 to achieve an optimal optic signal power level 312. Consequently, input current, such as the output of device 208, as shown in FIG. 2, should also change. The method and apparatus is able to adapt to such changes in temperature, or any other reason, thereby maintaining optimal output power for the optic signal.

FIG. 3B illustrates a plot of an exemplary current driver signal with exemplary control current designations imposed thereon, when the laser driver current designated $I_{mod}$ is AC coupled to the optic signal generator. The term AC coupled is defined to mean that the $I_{mod}$ current is added to the $I_{bias}$ current, after removing the DC component of $I_{mod}$, in order to generate the total optical driver current. The vertical axis 350 represents optical driver current from the laser driver 208, as shown in FIG. 2, into the optical signal generator 212, as shown in FIG. 2, while the horizontal axis 354 represents time. A time varying optic signal 358 is shown as a reference. Controlling aspects of the optic signal 358 are currents $I_{thresh}$, $I_{bias}$, and $I_{mod}$. $I_{thresh}$ represents the turn on threshold current for the optic signal generator. $I_{bias}$ represents the bias current for the signal and controls the off level or DC level for the optic signal generator. $I_{mod}$ represents the modulation current for the optic signal and controls the variance between the peak minimum and maximum values for the optic signal. By controlling one or more of these values, the optic signal is likewise controlled or varied. One or more of these values may also be controlled to control the extinction ratio, which is defined as the ratio of two optical power levels, where the numerator of the ratio is the high level, and the denominator of the ratio is the low level. Extinction ratio is typically expressed in dB, but can also be expressed simply as a numerical ratio.

FIG. 3C illustrates an exemplary plot of a current driver signal when the laser driver currents designated $I_{mod}$ and $I_{bias}$ are DC coupled. The term DC coupled is defined to mean that the $I_{mod}$ current is added to the $I_{bias}$ current, without removing the DC component of $I_{mod}$, in order to generate the total optical driver current. As shown, the vertical axis 370 represents optical driver current while the horizontal axis 374 represents time. In this example plot, $I_{mod}$ current 378 is shown in reference to $I_{bias}$, $I_{thresh}$, and $I_{mod}$.

Figure 4:
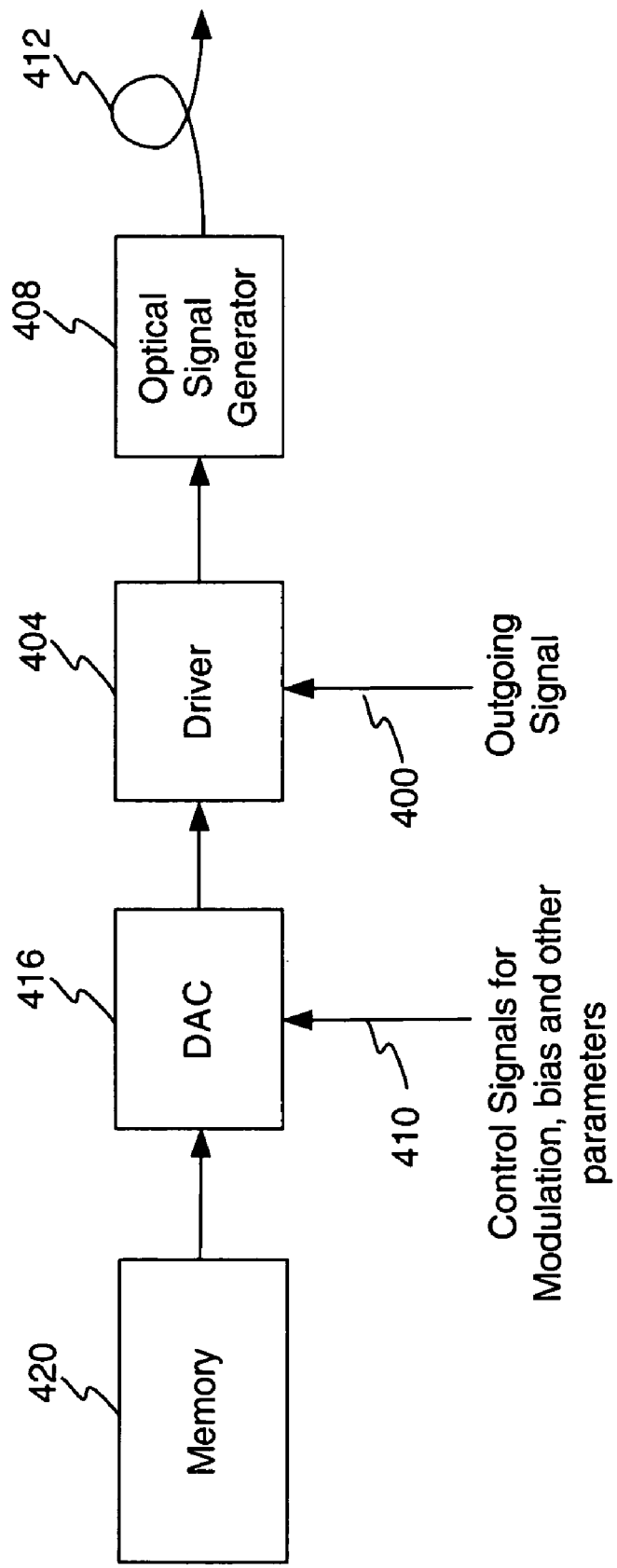
FIG. 4 illustrates a block diagram of an example embodiment of an open loop power control system.

FIG. 4 illustrates a block diagram of an example embodiment of an open loop power control system. This is but one example embodiment of an open loop power control system and, as such, other embodiments may be created without departing from the scope of the claims that follow. As shown, an input 400 carries an outgoing signal to a driver 404 configured to amplify or modify the outgoing signal in a manner suitable to power the optic signal generator 408. The optic signal generator 408 generates an optic signal, based on or representing the outgoing signal. The optic signal generator 408 outputs the optic signal on an optic fiber 412. As described above, the driver 404 and generator 408 may comprise any device capable of performing as described herein.

A memory 420 connects to a digital to analog converter 416, the output of which comprises one or more signals that are provided to driver 404. In operation, the memory 420 stores digital values which are output and converted to analog values, which in turn control one or more aspects of operation for the driver 404. It is contemplated that the aspects of the driver that may be controlled include, but are not limited to, the modulation current, the bias current, pulse width, edge characteristics, rise and fall time, and/or other aspects of the driver 404. In one embodiment, the values stored in the memory 420 may be referred to as control values or control signals because such signals or values in some way control one or more aspects of the driver or the driver output. It is contemplated that in some cases, there could be a control value to control the generator temperature via something like a thermoelectric cooler. However, in general, the control values themselves may be provided to another controller or driver device and not directly to generator 408. In one embodiment an input 410 connects to the ADC 416 to provide control signals for modulation, bias, or control of one or more other parameters.

As can be appreciated, the biasing level and/or modulation level may be controlled based on a memory value that is selected to control or drive the generator 408 in a desired manner. In addition, more than one control value may be utilized. For example, differing control values may be selected based on different factors, such as, but not limited to, time of day, age of components, components in use, temperature, system parameters, distance to receiving optic module and optic signal generator characteristics. As a result, the changes to any one or more factors may be accounted for by modifying the value in memory or utilizing a different value from memory.

It is also contemplated that the changes to the driver 404 or optic signal generator 408 may be accounted for by changes to the one or more control values stored in memory. For example, for a different particular brand or lot of optic signal generator 408, a particular drive signal that is required to achieve optimum or an otherwise desired optical signal power level, extinction ratio, or any other desired parameter may vary. By changing the memory values to control operation of the driver 404, use of different components, such as a different type generator, may be accommodated without circuit redesigns. Instead, the memory value may be changed to account for the different circuitry or device.

Figure 5:
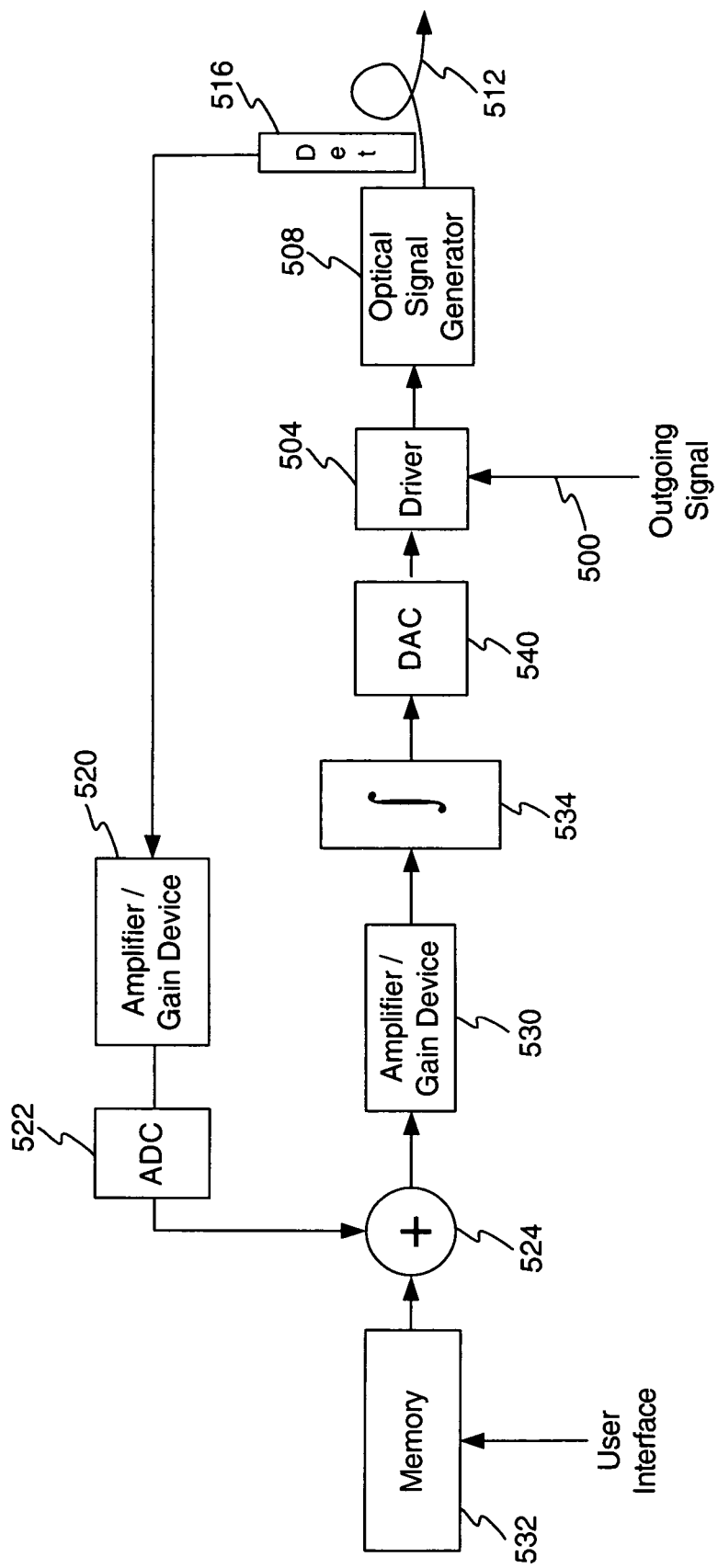
FIG. 5 illustrates an example embodiment of a closed loop power monitor to maintain optimal optic power.

FIG. 5 illustrates an example embodiment of a closed loop power monitor to maintain optimal optic power. As with all figures of the document, this figure is provided for purposes of discussion and, as such, the claims that follow are not limited to this particular embodiment. As shown, an input 500 configured to carry an outgoing signal is provided to a driver 504 configured to generate or modify the outgoing signal into a format suitable for powering or activating an optical signal generator 508 as shown.

The output of the generator 508 comprises an optical signal having parameters, such as power level and extinction ratio, controlled by the input from the driver 504 and the performance of the generator 508. The optic signal is provided to an optic fiber 512 for transmission to a remote station or other communication device, which may be co-located or remote. A detector 516 monitors one or more aspects of the optic signal, such as, but not limited to, power level or extinction ratio of the optic signal and converts the one or more aspects to an electrical signal, which in turn is provided to an amplifier 520 or some form of gain device. In addition, it is also contemplated that the detector 516 may detect the signal itself and generate an electrical representation of the optic signal on the fiber 512. The detector 516 may comprise a backscatter type detector, a PIN photo detector, avalanche photo detector, CdS photocell, any other optical device that changes resistance or develops current with exposure to light, or any other type of optic detector.

The amplifier or gain device 520 may comprise any device capable of modifying the power signal from the detector 516 for additional subsequent processing. The output of the detector 516 or amplifier 520 may be referred to herein as a feedback signal. The output from the amplifier 520 feeds into an analog to digital converter for conversion to a digital format and then to a summing junction or subtractor 524 configured to combine the feedback signal with one or more targets or control values or signals stored in the memory 532. The one or more target or control values or signals may comprise any of one or more values that are a starting point or default control values for the driver 504, such as to control bias current, modulation current, extinction ratio, power level or any other parameter of the driver, generator 508, or optic signal. The target value from the memory 430 is discussed below in more detail in connection with the operation of the embodiment shown in FIG. 5.

The one or more outputs of the junction(s) 524 are provided to an amplifier 530 or other type of gain device. It is contemplated that one or more junctions may be utilized to process one or more signals. It is further contemplated that the feedback signal may be converted to a digital signal by the analog to digital converter 522 or remain in the analog domain.

The amplifier 530 is configured to optionally modify the output(s) of the junction 524, such as by increasing or decreasing the magnitude of the signal, to a desired level. The junction 524 and the amplifier 530 may operate or be combined to generate an error signal, which may vary to either positive or negative. The output of the amplifier 530 connects to an integrator 534 or any other device configured to sum or combine the output from the junction 524 to generate a composite or integrated signal. The integrator 534 may comprise, but is not limited to, the following types of devices: accumulator, resistive/capacitive integrator, feedback loop, or nth order IIR filter. It is also possible to have a close loop system with the integrator bypassed and therefore have proportional signal control, or with an integrator signal+a proportional signal control, or with the proportional signal+integrator signal+higher order signal(s) control. The integrator 534 should be considered an optional device. In this embodiment, the integrator 534 may comprise a resistor/capacitor type integrator.

In this embodiment, the one or more outputs of the integrator 534 comprises one or more digital signals and, hence, a digital to analog converter (DAC) 540 which converts the digital signal to an analog format. As an advantage to the system described herein, at least a portion or all of the control loop is implemented in the digital domain thereby providing additional control, accuracy, and adaptability as compared to an analog solution. It should be noted that the one or more aspects may be implemented in the analog domain, or additional elements may be implemented as digital devices.

In operation at start-up, the feedback signal is zero and, as such, the memory 532 outputs the target value to the junction 524. As described above, the junction 524 combines or subtracts the feedback signal from the target value to thereby supplement the target value. At this stage, the feedback signal may be zero and, thus, the target value (i.e. one or more target values) is forwarded through the integrator 534 to the driver 504 to thereby control one or more aspects of operation of the driver. In this manner, the driver 504 is controlled by the one or more target values or signals to generate an optimum optic signal or an optic signal with the desired parameters to represent the outgoing signal.

During operation, the detector 516 detects the optic signal and generates an electrical feedback signal representative thereof, or representative of one or more aspects of the optic signal. The feedback signal and the target signal may comprise one or more signals and may be referred to herein as a value or a signal. The one or more feedback signals are amplified, converted to a digital value, and combined, either through addition or subtraction with the target value to supplement the target value(s). It is contemplated that over time the behavior of the generator 508 or other component may change and that this change may be undesirable as it may result in an optic signal that is other than optimal or does not meet specification. Consequently, the detector 516 will detect this change in the optic signal and the system through the feedback loop will supplement, either through addition or subtraction, the target value that was stored in memory 532 or a register. This modifies the target values, which may also be referred to as a control signal, which in turn affects the output from the driver 504 to account for or correct the behavior of the generator 508. The optic signal may deviate from optimal for other reasons, such as, but not limited to, temperature changes, or device behavior changes over time.

Regardless of the reason for the change in the power level of the optic signal, the detection method described herein detects such change because it advantageously monitors the actual optic signal and generates a feedback signal configured to return the optic signal to an optimal or desired state. Over time the feedback signal tracks the optic signal and continually corrects unwanted variations. This embodiment also has the advantage of allowing for user interface or input, such as modifications to the target value stored in memory via a user interface in conjunction with an open loop or closed loop digital format based on the optic signal control system. In addition, the feedback signal or any other aspect of the control loop may be monitored by one or more HW/SW control structures based elements to detect optic signal characteristics or feedback signal levels that may indicate an impending system failure or other condition.

Figure 6:
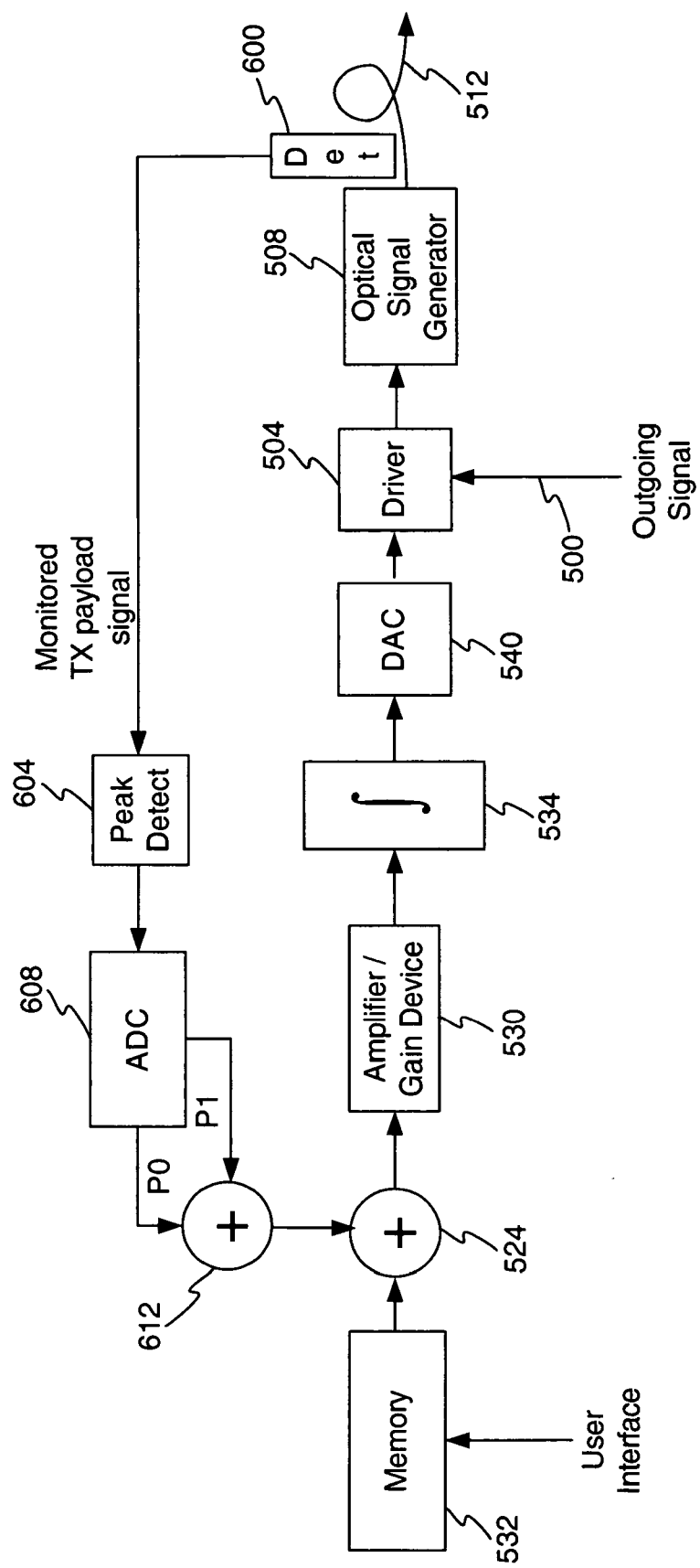
FIG. 6 illustrates a block diagram of an example embodiment of a closed loop power control system with data signal monitoring.

FIG. 6 illustrates a block diagram of an example embodiment of a closed loop power control system with data signal monitoring. As shown, this embodiment shares one or more similarities with the embodiment of FIG. 5 and, as such, similar items are identified with identical reference numerals. In this embodiment, the data signal, also referred to as the payload signal, is provided to a peak detector 604 in addition to other receiver systems, not shown, which process the signal. The data signal may be detected by a detector 600 or any other device or from an output from the optical signal generator 508. The signal is then provided to an analog to digital converter 608. The analog to digital converter 608 converts the feedback signal to a digital format, assuming the signal is not already provided in a digital format. The analog to digital converter 608 is configured to convert the $P_0$ and $P_1$ values for the received signal. In this embodiment, the values $P_0$ and $P_1$ are proportional, and represent, or may be processed to represent the extinction ratio. In one embodiment, the extinction ratio is defined as the fraction of the optical power of the marks (ones) to the optical power of the spaces (zeros) in decibels. The $P_1$ and $P_0$ may be defined as the power of the marks and spaces respectively. In one embodiment, it is desired to maintain the extinction ratio constant or drift of the optic signal, which could lead to increased bit error rates.

Factors other than $P_0$ and $P_1$ maybe detected in other embodiments. By detecting $P_0$ and $P_1$, the modulation level may be detected. It is also contemplated that average power or any other aspect of the optic signal's power level may be detected. The one or more peak values are provided by the peak detector 608 to a junction 612, which, in this embodiment, determines the difference between the two or more peak values. This difference value, which may be modified in any manner by the junction 612, such as scaled, amplified, or decremented, or integrated, is provided to junction 524 as a feedback signal or compensation signal. This feedback or compensation signal may be used to modify one or more aspects of the optic signal transmitted from the generator 508.

In operation, an outgoing signal is provided to the driver 504 for conversion to an optical signal by the optical signal generator 508. The generator 508 generates an optical signal representative of the outgoing signal and one or more aspects of operation of the generator or of the optic signal is controlled by the control signal input from the DAC 540. The control signal is stored in the memory 532, which may be updated via the user interface. A compensation or correction signal, if necessary, from the feedback loop is combined with the control signal in the junction 524. The compensation signal is generated by monitoring the peak values, such as the modulation or $P_0$ and $P_1$, of the outgoing optical signal and generating the compensation or correction signal in junction 612. The compensation or correction signal may also be referred to as an error signal. The resulting control signal, which may be modified by the compensation or correction signal (i.e. feedback signal) is amplified in device 530, optionally integrated or summed in element 534 and converted to an analog format in converter 540.

If one or more parameters, such as the extinction ratio of the optic signal changes, such change is detected via the feedback loop (600, 604, 608, 612) and a compensation signal generated that when combined with the control signal or target signal from the memory 532 causes the optic signal to return to the optimal or desired power level. In this manner, the optic signal is monitored and maintained at an optimum level there by insuring a high bit rate, low error rate, and stable communication. This embodiment utilizes one or more peak detectors 608 to detect one or more aspects of the transmitted signal. Although in this embodiment, the values $P_0$ and $P_1$, which may be considered peak values, are monitored, in other embodiments, other factors, parameters, or peak values may be monitored to determine if the optic signal is within specification.

Figure 7:
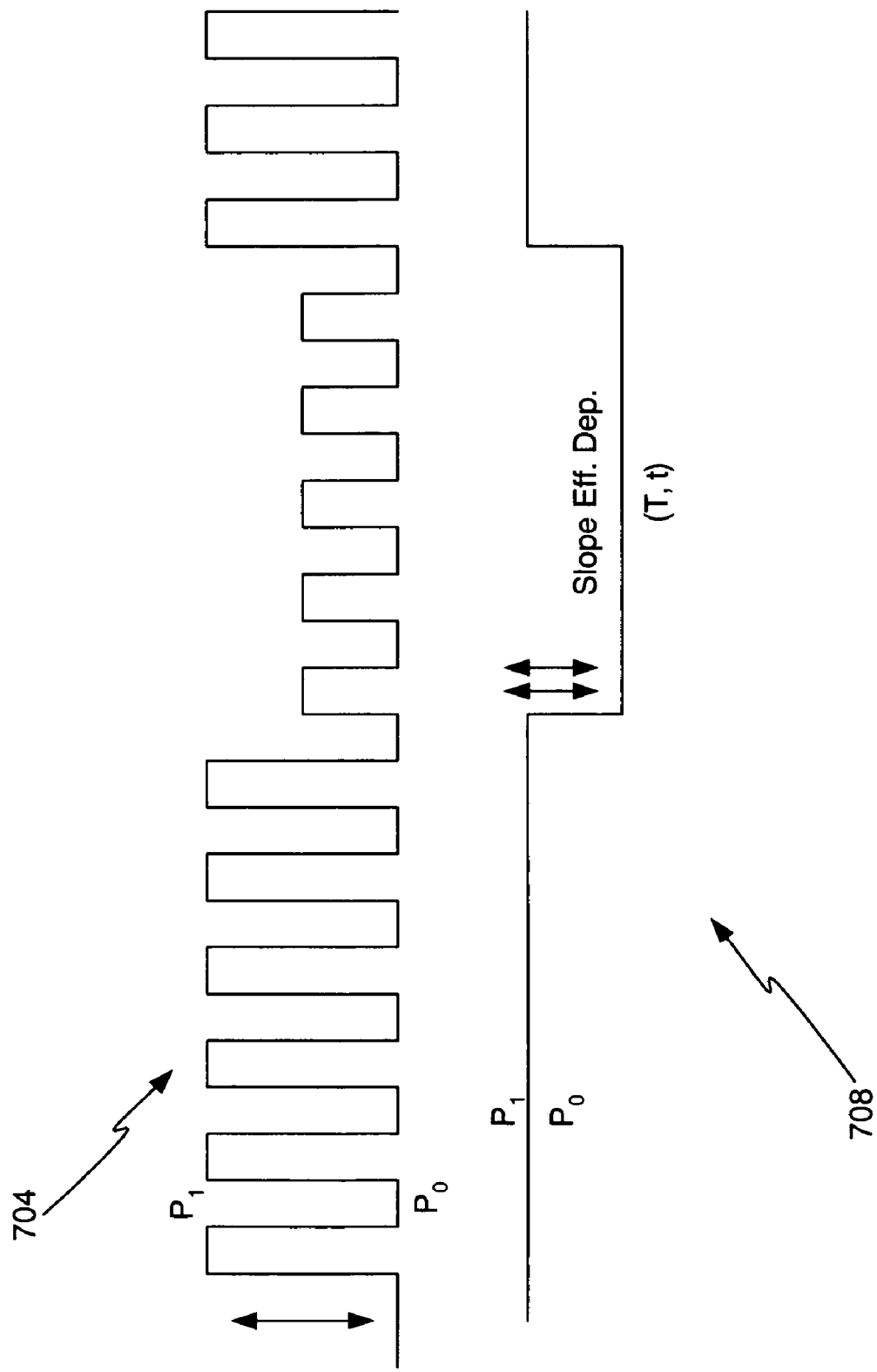
FIG. 7 illustrates an example plot of a data signal with an associated low frequency side channel (LFSC).

FIG. 7 illustrates an example plot of a data signal with associated low frequency side channel (LFSC). In one embodiment, the optic communication system may utilize a LFSC modulated onto or with the payload or data signal. As shown, plot 704 comprises a data signal while plot 708 comprises a LFSC signal that may be imposed or modulated onto the data signal 704. In one embodiment, the value for $P_{0d}$ and $P_{1d}$ for the data signal may be determined by monitoring the $P_{0LFSC}$ and $P_{1LFSC}$ for the LFSC signal where $P_{0d}$, $P_{1d}$, $P_{0LFSC}$ and $P_{1LFSC}$ are defined as signal levels proportional to the optical power in the spaces (zeros) of the data, marks (ones) of the data, spaces (zeros) in the LFSC data, and marks (ones) in the LFSC data respectively. Monitoring the LFSC signal provides the advantages of simplifying the peak detector circuitry and allows for communications via a link which is not dependent on payload data.

Figure 8:
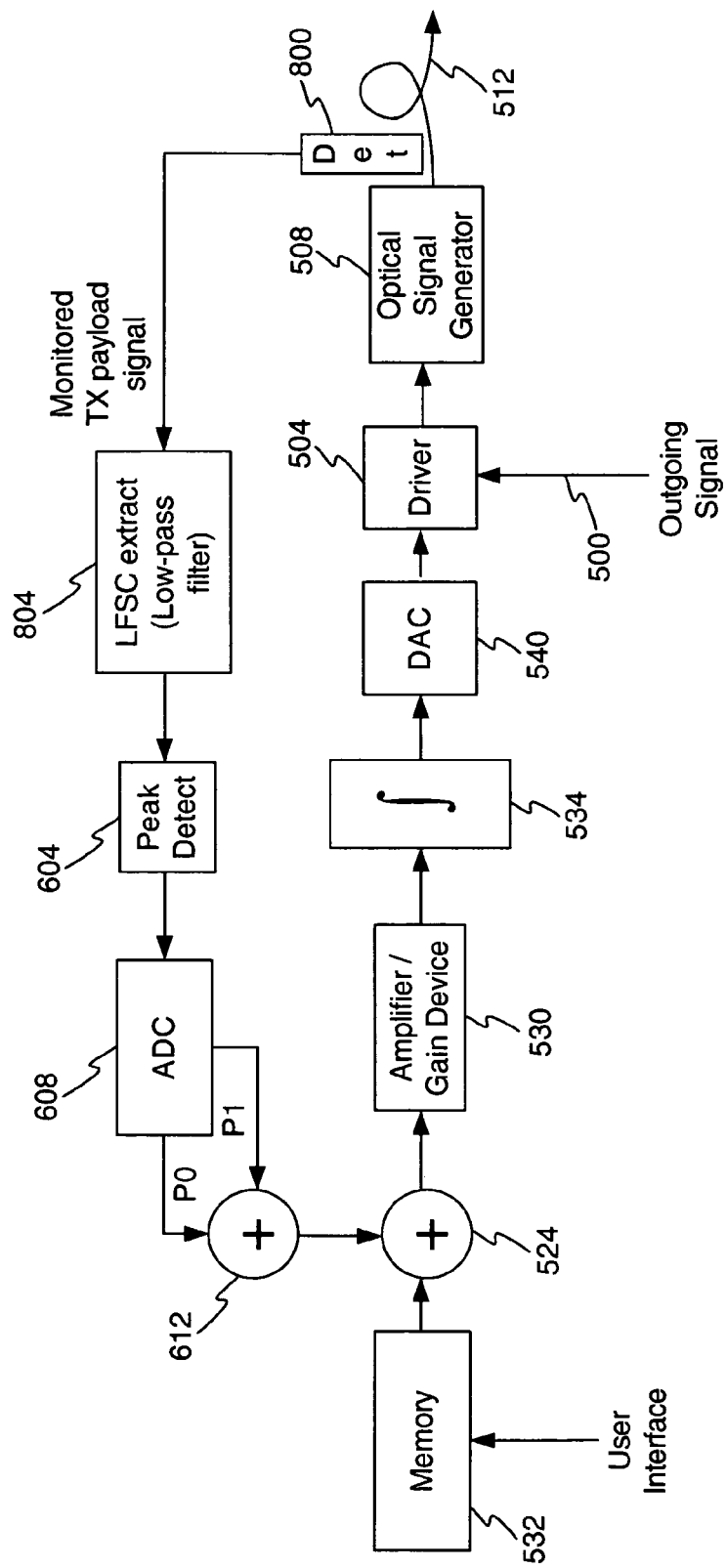
FIG. 8 illustrates a block diagram of an example embodiment of a signal power control system configured to monitor a LFSC signal.

FIG. 8 illustrates a block diagram of an example embodiment of a signal power control system configured to monitor a LFSC signal. As shown, this embodiment shares one or more similarities with the embodiment of FIG. 6 and, as such, similar items are identified with identical reference numerals. In this embodiment, the data signal, also referred to as the payload signal, i.e. outgoing signal, is provided to the driver 504 as is described above. The payload signal is created into an optic signal by the generator 508 and the optic signal provided to the fiber 512 may be detected by a detector 800 or any other device. The detection may also occur within the generator 508 or be a dedicated optic output from the generator. The detector 800 may be configured to detect the optic signal, which may comprise the data signal and the LFSC signal. The detector output is provided to a filter 804 or other processing apparatus configured to extract the LFSC signal. Thereafter, the LFSC signal is provided to a peak detector 604. The LFSC signal is then processed by an analog to digital converter 608 in a manner similar to that described above to isolate information regarding the modulation, extinction ratio, or other aspect of the optic signal. In the embodiment of FIG. 8, the signals $P_0$ and $P_1$ of the LFSC signal are isolated and provided to the junction 612 to generate a compensation or correction signal. In this embodiment, the extinction ratio of the LFSC signal may be considered as being related to the extinction ratio of the payload signal. This signal is in turn provided to the junction 524 where it may optionally adjust or supplement the driver control signal stored in memory 532.

Figure 9:
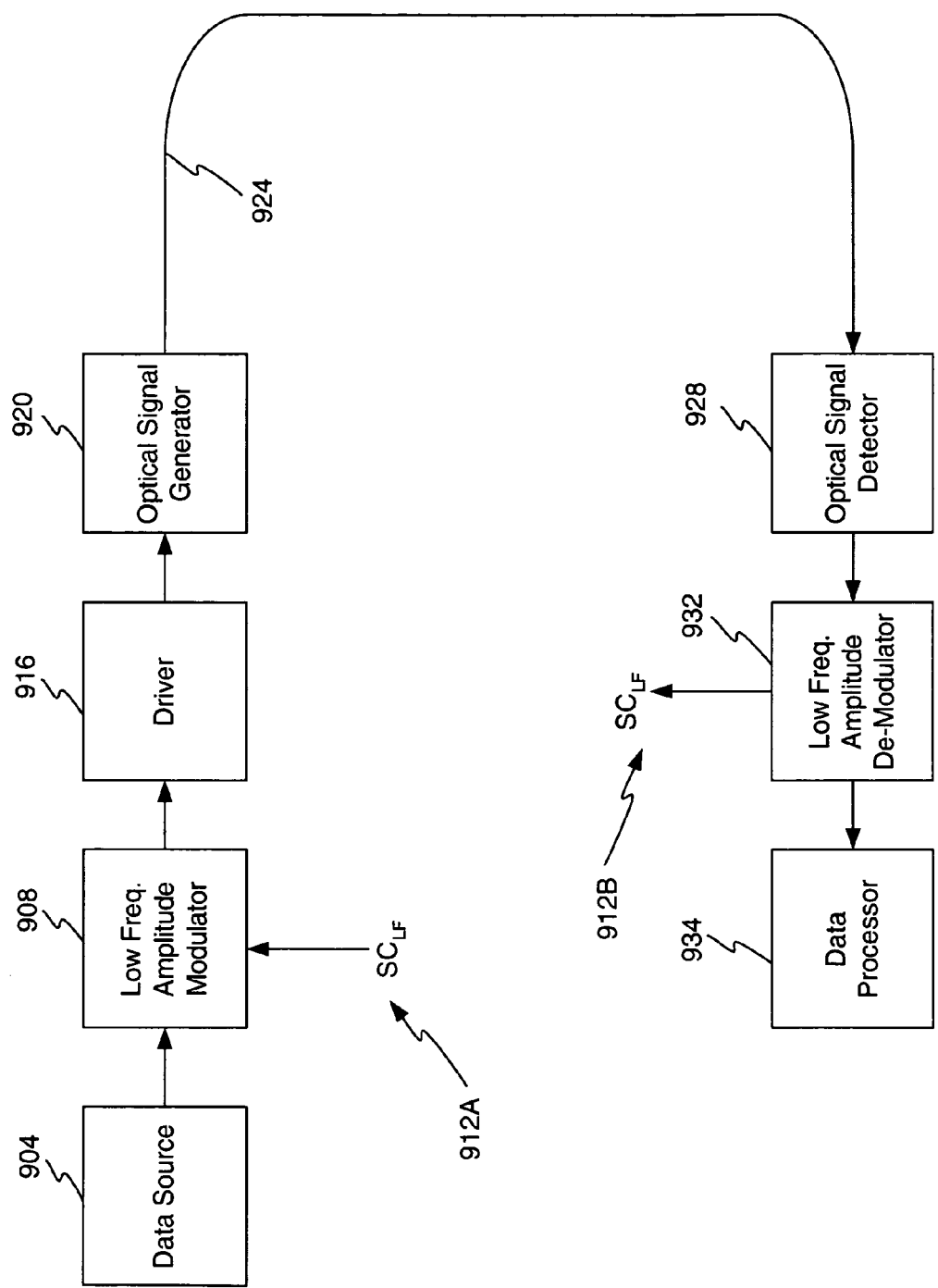
FIG. 9 illustrates a block diagram of an example embodiment of an optical communication system having an amplitude modulated low-frequency side channel configured to convey system data.

FIG. 9 illustrates a block diagram of an example embodiment of an optical communication system configured with an amplitude modulated low-frequency side channel configured to convey system data. In other embodiments, other methods of modulation may be utilized. As shown, a data source 904 provides network data for communication over the optical network. The data source 904 may comprise any source of network data including, but not limited to, a computer network, communication device router, switch, transceiver, hub, bridge, repeater, or any other source of data. The output of the data source 904 feeds into a low frequency amplitude modulator 908 which is configured to amplitude modulate data from a low frequency side channel 912A ($SC_{LF}$) onto the network data that is received from the data source 904. In one embodiment, the low frequency amplitude modulator 908 modulates the network data from the data source 904 responsive to the data on the side channel ($SC_{LF}$) and the data on the side channel may comprise system data, such as to control or monitor the communication system.

The output of the low frequency amplitude modulator 908 connects to a driver 916 that is configured to convert the amplitude modulated data source to a signal capable of driving an optical signal generator 920. It is contemplated that any type driver system or circuit 916 may be utilized. Likewise, the optical signal generator 920, which connects to one or more optical conductors 924, may comprise any device or system capable of generating one or more optical signals. Such devices include, but are not limited to, continuously modulated optical sources, such as, light-emitting diodes (LED) and various types of lasers, or they might be continuously emitting optical sources modulated by an external device, such as, electro absorptive modulator (EAM) or Lithium Niobate Modulator.

It is further contemplated that the system data in the form of the $SC_{LF}$ may be provided to the driver 916 to control operation of the one or more driver signals that are provided to the optical signal generator.

Because the network data from the data source 904 is amplitude modulated by the system data or secondary data on the low frequency side channel 912A, the fiber optic conductor(s) 924 concurrently carries the network data and the system data. Transmission of the system data in this manner does not disturb transmission or reception of the network data. It is contemplated that the intensity of the optical signal may be modified sufficiently so that the intensity changes may be detected to recover the system data, but not so significantly that the network data may not be recovered or that the data rate for the network data is reduced.

At a receiving station or at the detector, the combined signal is provided to an optical signal detector 928, which is configured to convert the optical signals to a corresponding electrical signal for subsequent processing. An amplifier (not shown in FIG. 9) may optionally be configured as part of the optical signal detector 928 or may reside after the detector 928 to amplify the received electrical signal.

The electrical signal is then provided to a low frequency amplitude demodulator 932 that is configured to detect the low frequency variations in the received signal to thereby isolate the system data on the low frequency side channel 912B. The system data recovery may also occur within an amplifier of the receiver. Because the system data controls the amplitude modulation of the network data, the system data may be recovered by monitoring one or more aspects of the received signal. After processing by the low frequency amplitude demodulator 932, the network data is forwarded to the data processor 934 which may be configured to process or otherwise utilize the network data. It is contemplated that the signal passed to the processor 934 may comprise the received signal. The amplitude modulation of the signal is such that it does not interfere with subsequent processing of the network data. In other embodiments, other forms of amplitude modulation may require processing of the network data by the data processor 934 in such a way to enable recovery of the received network data. These operations are described below in more detail.

The embodiment shown in FIG. 9 is but one possible example embodiment of a communication system utilizing amplitude modulation of a high frequency signal to encode or include additional data that, in this embodiment, comprises a low frequency side channel of system data. This enables transmission between stations to include system data including, but not limited to, data regarding the operation or performance of the optical signal generator, driver, the error rate, the transmit power, the extinction ratio, received signal, operating environment, or any other system parameters. Processing or monitoring of this data allows for inter-station communication to thereby adjust transmission or reception parameters of operation to either improve operation or monitor for potential failures or degradation. This low frequency signal channel may also be monitored by the detector to evaluate the power level of the outgoing optic signal.

Figure 10:
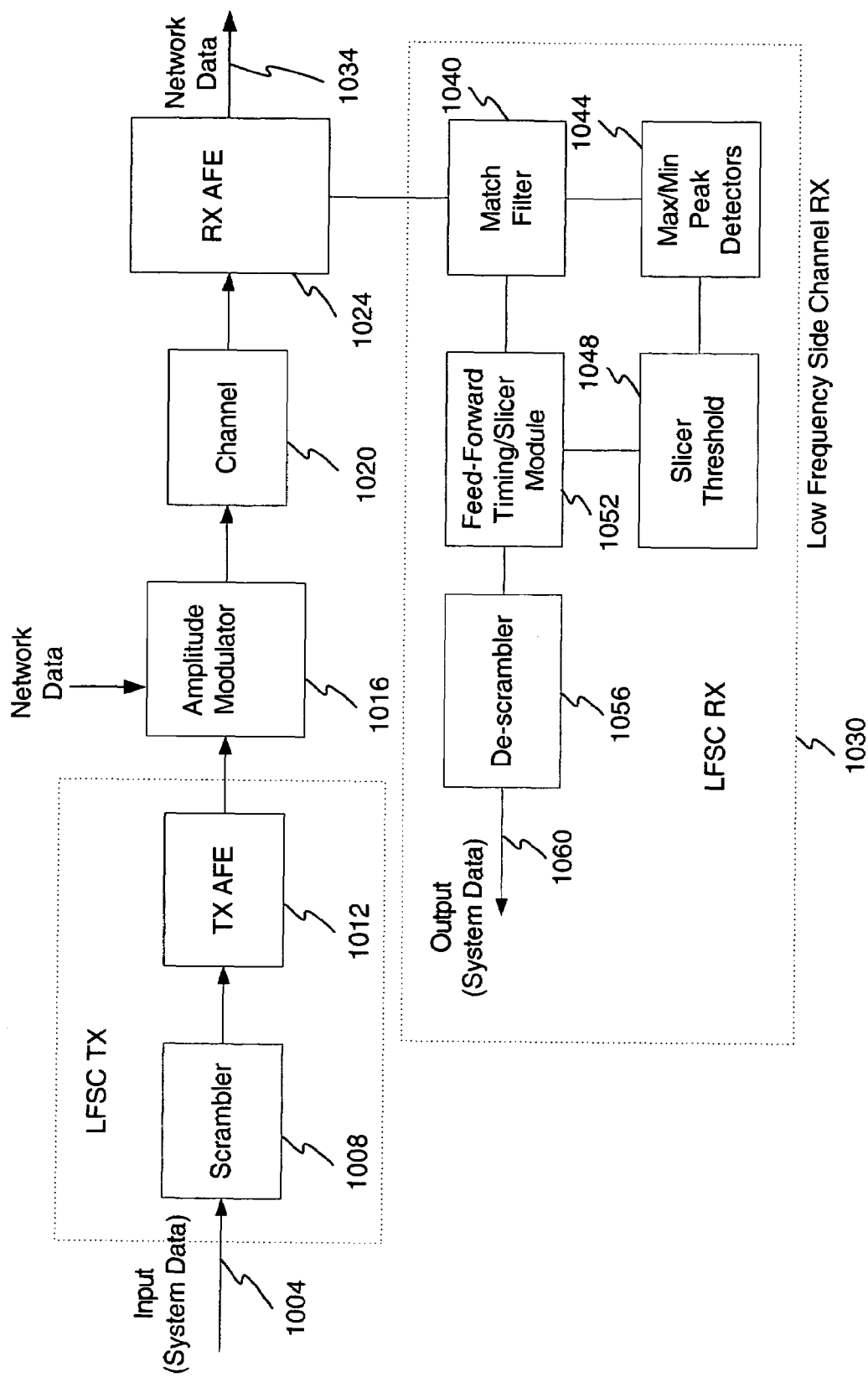
FIG. 10 illustrates a block diagram of an example embodiment of a transmitter-receiver pair configured to amplitude modulate network data to include system data.

FIG. 10 illustrates a block diagram of an example embodiment of a transmitter-receiver pair configured to amplitude modulate network data to include system data. The system of FIG. 10 may be utilized to incorporate low frequency side channel data with the data signal and this side channel data may be monitored to detect the optic signal power level. As would be understood by one of ordinary skill in the art, components in addition to those shown would likely be included to enable operation of such a communication system. In addition, the components shown in FIG. 10 comprise the components relevant to the present invention and those helpful to gain an understanding of the invention.

In the embodiment shown in FIG. 10, an input 1004 provides system data to a scrambler 1008. The scrambler 1008, which is known by those of ordinary skill in the art, processes the system data to inhibit undesirably long strings of logic value zeros or logic value ones which may otherwise disrupt system operation. The output of the scrambler 1008 feeds into a transmitter analog front end (AFE) 1012 which is configured to convert the digital network data to an analog format suitable for transmission over one or more channels, such as channel 1020. As is understood by those of ordinary skill in the art, digital data may be transmitted over a channel in an analog format.

The output of the analog front end (AFE) 1012 feeds into an amplitude modulator 1016 and is also configured as a signal generator. In one embodiment it is possible for the amplitude modulator to reside inside the AFE and the AFE could be an optical power generator or a current driver/optical power generator pair. In this embodiment, the amplitude modulator 1016 also receives system data as an input. The amplitude modulator 1016 is designed to concurrently transmit the system data and the network data over the channel 1020. Amplitude modulation of the system data onto the network data does not affect the communication system's ability to receive and detect the network data at a receiver.

In the embodiment shown in FIG. 10, the system data controls the amplitude modulation of the network data whereby depending upon the logic level of the system data, one or more aspects of the network data may be modified thereby causing the network data, when transmitted over the channel 1020 to convey not only the network data but also the system data.

In the embodiment of FIG. 10, it is contemplated that any type modification to the network data may occur that utilizes amplitude modulation techniques. For example, it is contemplated that the system data may control the bias level of the network data, the upper boundary intensity levels of the network data, the lower boundary intensity levels of the network data, the overall power level or bias level of the network data, or any combination of these factors. The various methods of operation of the amplitude modulator 1016 are described below in more detail.

The output of the amplitude modulator comprises an amplitude modulated version of the network data, which is provided to the channel 1020. It is contemplated that the channel 1020 may comprise any type communication channel and the channel may comprise one or more optical channels or additional electrical type conductors. It is also contemplated that the channel may comprise free space. Furthermore, channel drivers and optical signal generators may be located between the amplitude modulator 1016 and the channel 1020, although it is contemplated that the driver and signal generator may be part of the apparatus performing the amplitude modulation of the network data. As such, the amplitude modulator may also then be configured as the driver and signal generator.

Turning now to the receiver side of the transmitter-receiver pair, a receiver analog front end 1024 processes the received amplitude modulated network data as would be understood by one of ordinary skill in the art. The network data, which may also include the amplitude modulation effects, is provided on output 1034 for subsequent processing. Amplitude modulation does not interfere with subsequent processing of the network data because the degree of amplitude modulation occurring on the network data is not significant enough to interfere with subsequent processing but is significant enough to be detected by the low frequency side channel receiver 1030, which also receives the amplitude modulated network data as shown.

The low frequency side channel receiver comprises a match filter 1040 configured to receive and selectively filter a particular frequency band of the output from the analog front end 1024. The match filter 1040 also connects to a feed-forward timing module 1052 and a min/max peak detector 1044. The min/max peak detector 1044 also connects to a slicer threshold 1048, which in turn connects to the feed-forward timing/slicer module 1052 as shown. The output of the feed-forward timing/slicer module 1052 feeds into a de-scrambler 1056 configured to reverse the effects of the scrambler in the transmitter. The system data is shown on output 1060 after having been recovered by the low frequency side channel receiver.

In operation, the match filter 1040 comprises a filter that is tailored to have a frequency response of a particular frequency or frequency band. In this embodiment, the RX AFE 1024 separates the low frequency system data from the network data. By detecting the amplitude modulation of the network data, the system data may be recovered. The min/max peak detectors 1044 monitor one or more aspects of the recovered system signal. In this embodiment, the min/max peak detectors 1044 monitor the maximum and minimum values of the system data to thereby detect the proper levels for the slicer threshold. The feed-forward timing/slicer module 1052 and slicer threshold 1048 operate to thereby generate the output signal provided to the de-scrambler 1056. In other embodiments, other configurations for and methods of operation of the low frequency side channel receiver 1030 may be utilized. As discussed below in more detail there are numerous methods by which the system data may be utilized to modulate the network data and, as such, the configuration and operation of the low frequency side channel receiver is dependent upon the particular method of amplitude modulation utilized. For example, it is contemplated that max/min peak detectors inside the RX AFE 1024 may comprise a power monitor configured to monitor the average power or bias level of the modulated network data and based on this average power or bias level the system data may be recovered.

It should be noted that the low frequency side channel data is at a frequency rate which is below the network data. In one embodiment, the frequency of the system data is 100 times slower than the frequency of the network data. Thus, for every data sample of system data, there may be 100 or more samples of network data. In one example embodiment, the system data is provided at a rate of 1000-10,000 Hertz while the network data may be at 1 GHz or higher frequency. In one embodiment, the network data is at a rate that is greater than 10 times the data rate of the system data. As can be appreciated, there will be numerous samples of network data for each system data sample and, because of the use of the scrambler 1008, the system data will include numerous logic zero values and numerous logic one values. In such an embodiment, regardless of the particular amplitude modulation scheme utilized, the system data can be recovered.

Figure 11:
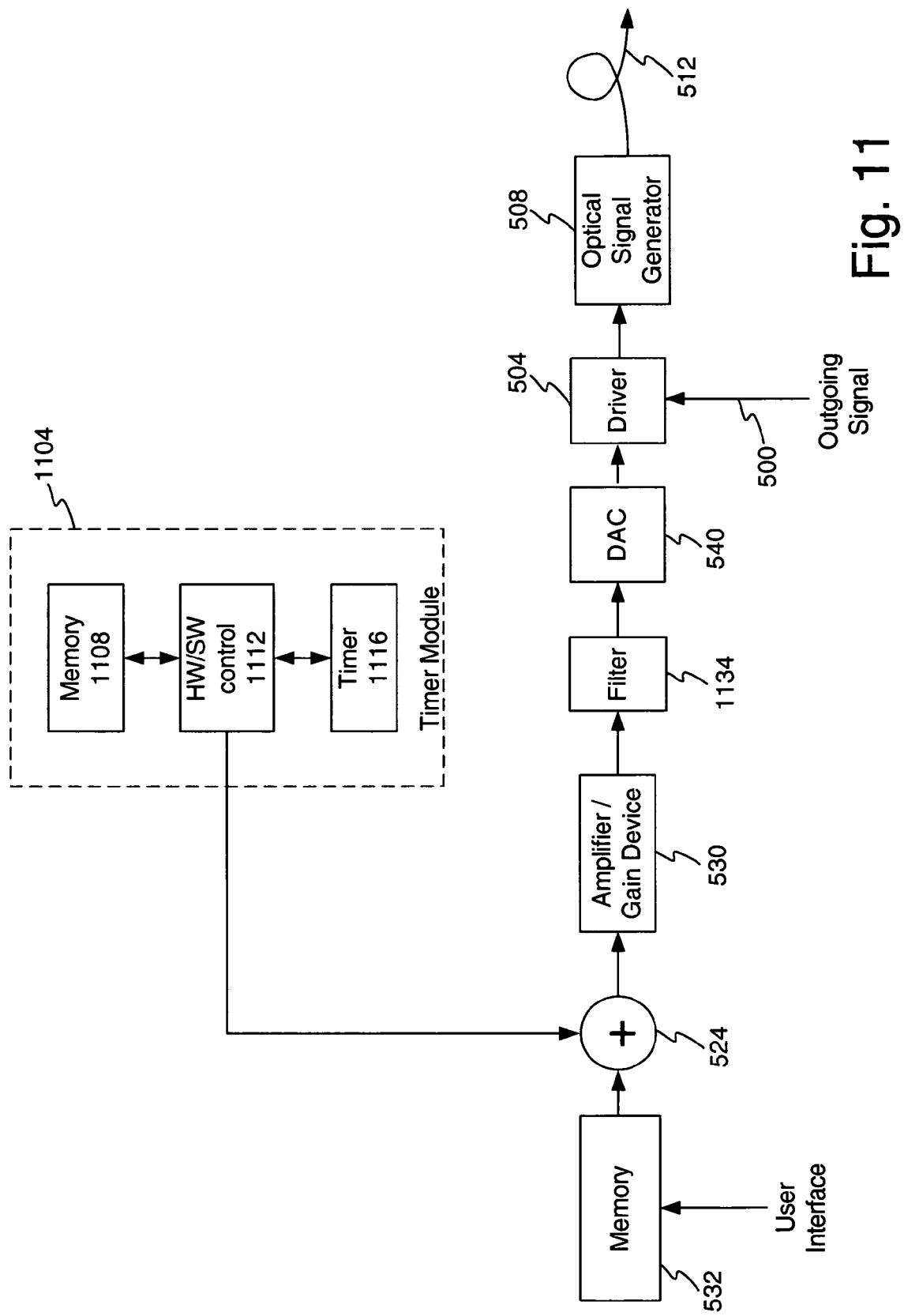
FIG. 11 illustrates a block diagram of an example embodiment of an optic signal power control system with a timer control system.

FIG. 11 illustrates a block diagram of an example embodiment of an optic signal power control system with a timer module. As shown, this embodiment shares one or more similarities with the embodiment of FIG. 5 and other embodiments, and as such, similar items are identified with identical reference numerals. Elements that are described above are not described again.

In this embodiment, the driver control structure described above receives a compensation or correction signal from a timing module 1104. In this example embodiment, the timing module 1104 comprises a memory 1108, a HW/SW control 1112 and a timer 1116. As shown, the timer 1116 comprises any element or device capable of tracking the in-service time, operational time, or age of the generator 508 or other components or systems. Any type device, such as, but not limited to, a timer, counter, clock, crystal, or periodic waveform generator may be utilized as the timer 1116.

The output of the timer 1116 comprises a signal representing the in-service time of the generator 508 or some other indicator of the generator's age, which may be an in-service time or an age value regardless of time that the generator has actually been in use. The HW/SW control 1112 operates in connection with the memory to analyze the time value from the timer 1116. In one embodiment, the HW/SW control 1112 utilizes the timer value as the compensation or correction value. In one embodiment, the HW/SW control 1112 processes the timer value into the compensation or correction value. In one embodiment, the HW/SW control 1112 utilizes the timer value as a look-up value to perform a look-up in memory 1108 to thereby retrieve a compensation or correction value stored in the memory. It is contemplated that in one embodiment, the HW/SW control 1112 may compare the timer value to a threshold time value, which may be stored in memory 1108 and if the time value is less than the threshold, then no compensation or correction signal is output, or a zero value is output.

The compensation or correction value is output to the junction 524 to modify the one or more control values from the memory 532. One or more compensation or correction values may be output from the timer module 1104. The other aspects of the system shown in FIG. 11 operate as described above. However, because this is an open-loop control system, the integrator 534 has been replaced with a filter 1134.

As described above, optic signal generator output power verses input current swing characteristics, such as, for example, the slope efficiency, is a function of temperature and device lifetime, i.e. the age of the generator. The temperature dependence of the slope efficiency may be intrinsic to the type of optic signal generator. Typically, the slope efficiency of the output power versus input current curve decreases as the temperature increases. Moreover, the slope can have a wide process variation range. If the slope efficiency changes, such as, in response to temperature changes, then the optical signal generation may generate a signal that has a different extinction ratio, which is related to slope efficiency, and which may be out of specification. In addition, different generators may also have different slope efficiencies, which may cause the optic signal power level to be at other than an optimum level. As a result, it may be desired to account for changes in temperature or performance differences between devices or circuits. By way of background, the extinction ratio is defined as the fraction of the optical power of the marks (ones) to the optical power of the spaces (zeros) in decibels. In one embodiment, it is desired to maintain the extinction ratio constant to avoid degradation or drift of the optic signal, which could lead to increased bit error rates.

Figure 12:
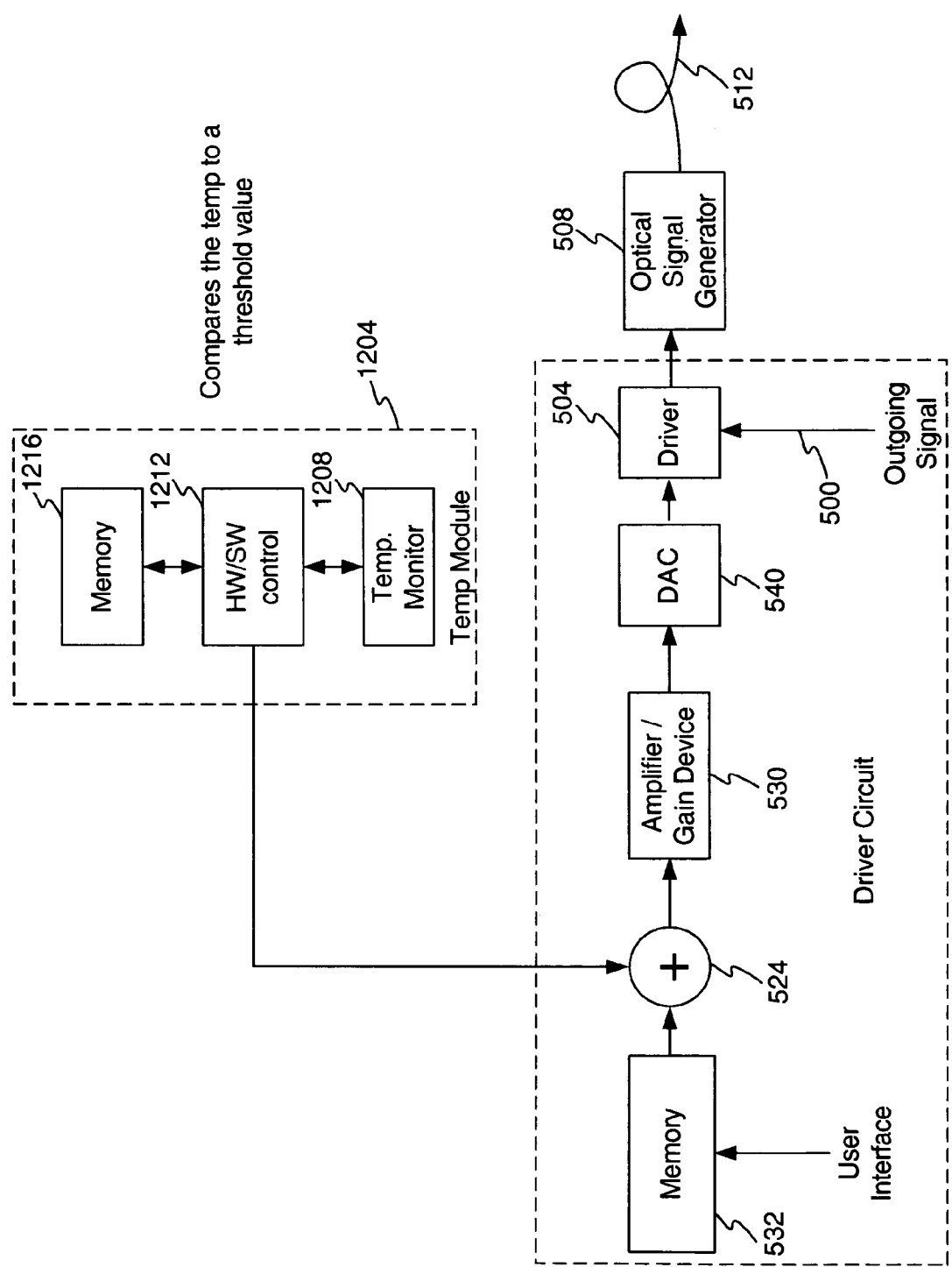
FIG. 12 illustrates a block diagram of an example embodiment of an optic signal power control system with a temperature module.

In one embodiment, the drawbacks and problems of the prior art may be overcome by utilizing a temperature module. FIG. 12 illustrates a block diagram of an example embodiment of an optic signal power control system with temperature monitor. As compared to FIG. 5, similar or identical elements are labeled with identical reference numbers. In this example embodiment, a temperature module 1204 comprises a temperature module 1208, a HW/SW control module 1212, and memory 1216. Other embodiments may adopt other configurations.

The temperature monitor 1208 comprises a device configured to output a signal, either digital or analog, representative of the temperature. The monitor 1208 may be external to the integrated circuit or configured as part of or built into the power control integrated circuit. Any type temperature monitor 1208 may be utilized and it may be calibrated, if necessary, in any manner.

The memory 1216 is configured to store one or more temperature threshold values. The temperature threshold values ($T_{thresh}$) may comprise one or more values representing a temperature value at which further increases in temperature will affect signal generator operation. Thus, it is contemplated that in one embodiment, for temperatures above the threshold value, the optical signal generator may behave differently, due to a different slope efficiency, and thus, compensation may be desired or necessary. Reference to FIG. 3A may be helpful in understanding this principle. The process, which may be employed by the embodiment of FIG. 12, is described in more detail below in connection with FIG. 13.

The output of the temperature monitor and the memory 1216 are provided to the HW/SW control module 1212. In one embodiment, the HW/SW control module 1212 is configured to compare the threshold value to the temperature monitor, and based on the comparison, output a temperature module output to the driver circuitry as shown. The temperature module output may comprise any type control signal or error signal. In one embodiment, the output of the temperature module 1204 comprises the threshold value or a zero value if the temperature is below the threshold temperature or a compensation value if the temperature is above the threshold temperature.

In addition, it is contemplated that the HW/SW control module 1212 may comprise logic and one or more comparators to perform a comparison between the threshold value and the temperature monitor value of the actual temperature.

The one or more outputs of the temperature module 1204 feeds into the junction 524 to thereby supplement or decrement the driver control values output from memory 532. It is also contemplated that the temperature module 1204 may output a zero value. Operation of the remaining elements may occur in a manner generally similar to that described above.

In this particular embodiment, however, the system is configured as a first order type system and, as such, higher order terms in temperature are not utilized (such as $T^2$, $T^3$, ... $T^N$). In other embodiments, the system may utilize second order or higher order temperature terms. (This is not a closed loop system so the integrator could make the system unstable as it will never have zero as an input. Higher order here refers to the use of higher order non linear terms of the independent variable temperature).

It is further contemplated that in one configuration or method of operation, the memory 1216 and HW/SW control module 1212, or any processor or controller, may be configured to store and process one or more equations or calculations and using these equations or calculations and the temperature monitor input, the system may arrive at desired or optimal compensation value to be provided as the temperature module output. By way of example, and not limitation, one or more equation coefficients may be stored in the memory 1216. The equations may comprise first through Nth order polynomials in temperature or temperature monitor value, where N comprises any positive whole number. In one embodiment, the following equation coefficients may be utilized, in conjunction with the detected temperature value from the temperature monitor and its higher order terms to calculate a compensation value to be output from the module 1204.

$C_T(T) = C_1 T + C_2 T^2 + \ldots + C_N T^N$. Where $C_T(T)$ is the compensation signal going to the junction 524, the coefficients $C_N$ for any integer N are stored in memory and T is the temperature value from the temperature monitor.

The coefficients $C_N$ may be arrived at utilizing least mean squared method, optimization methods, or any other type analysis. It is further contemplated that the coefficients may be arrived at using product data sheets, such as a data sheet for a particular signal generation device, or from in lab analysis and testing. In this manner, the system may be quickly and accurately tailored to any optic signal generator 508 or driver circuit, which may also suffer a performance change as the temperature changes.

The embodiment shown in FIG. 12 is an example embodiment and, as such, it is contemplated that one of ordinary skill in the art may arrive at different variations or arrangements without departing from the scope of the claims that follow. For example, the memory 1216 and memory 532 may be combined into a single memory module or separated into two or more elements as shown. In addition, the memory 1216 may be considered optional.

Figure 13:
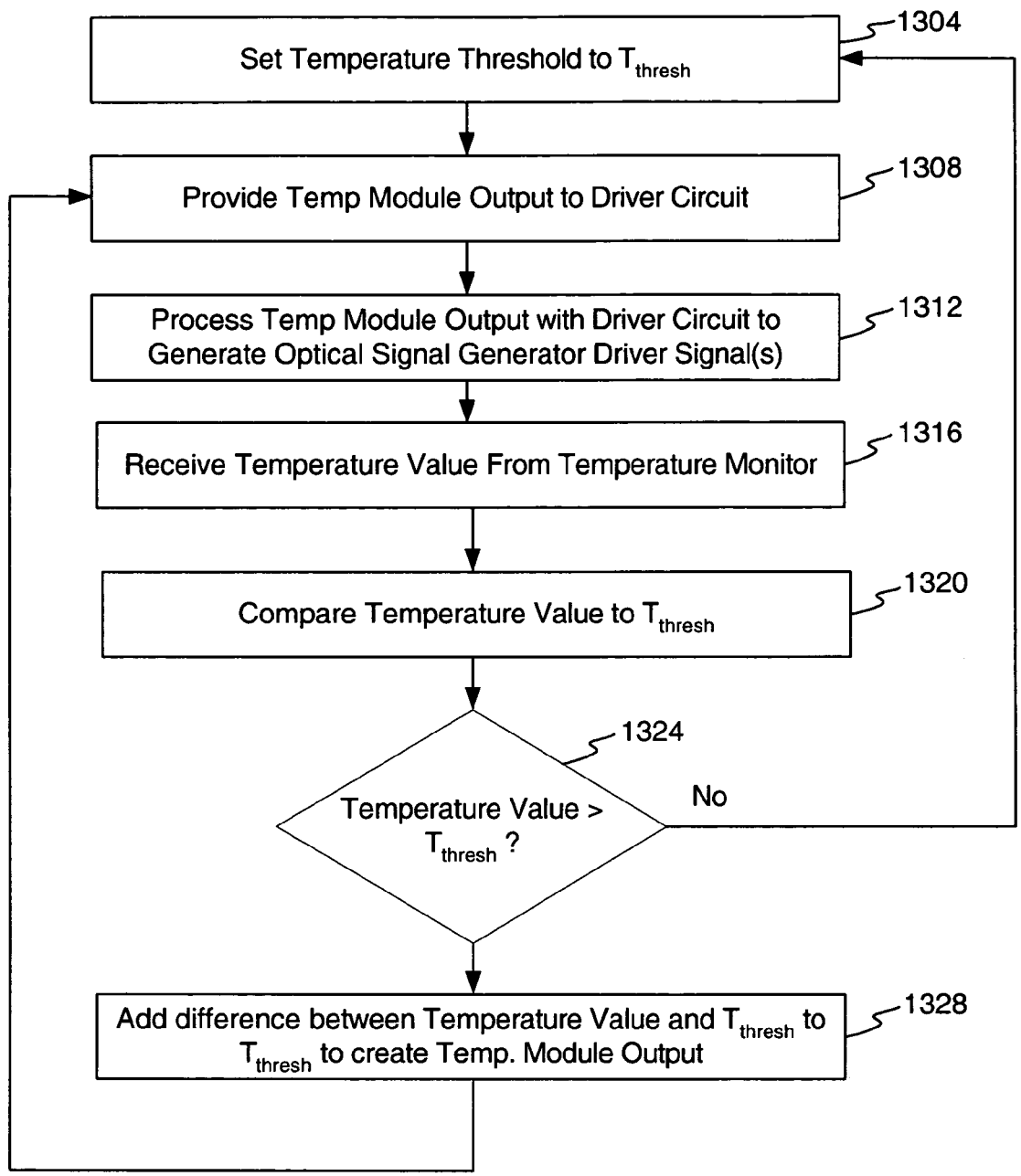
FIG. 13 illustrates an operational flow diagram of an example method of operation of a temperature controlled feedback system for optic signal power control.

FIG. 13 illustrates an operational flow diagram of an example method of operation of one example embodiment of the system shown in FIG. 12. As described above, other example methods of operation are possible in addition to the method described below. In addition, the structure of this method may be applied to methods, which monitor the optic signal power level, but which do not utilize a temperature monitor, such as, but not limited to, timer based systems or feedback based systems.

At a step 1304, the system sets the temperature module output to the temperature threshold value ($T_{thresh}$) as may be stored in memory. This may be considered as happening at startup or other specified times.

At a step 1308, the system provides the temperature module output to the driver circuit, such as to the junction 524 (FIG. 12). The output from the temperature module may comprise a compensation value. Thereafter, at a step 1312, the driver circuit may process and utilize the compensation value to generate an optical signal generator driver signal or a control signal that controls the driver. In this manner, the power of the optic signal is controlled.

Next, at a step 1316, the controller or processor receives the temperature value, representing the actual temperature, from the temperature monitor. At a step 1320, the operation compares the actual temperature value, from the monitor, to the threshold value. If at step 1324, the temperature value is less than or equal to the threshold value, then the operation returns to step 1304 and the threshold value is utilized as the output. Alternatively, instead of the threshold value being utilized, a zero value, or other value stored in memory may be utilized as the output from the temperature module or as a compensation value.

Alternatively, at a step 1324, the operation may determine that the temperature value is greater than the threshold value and, as such, the operation may advance to step 1328. In this embodiment, at step 1328, the system adds the difference between the temperature value and the threshold value to create the temperature module output. Alternatively, the difference value, or some other value, may be output as a compensation signal.

After step 1328, the operation will return to step 1308 and repeat as necessary during operation to compensate for changes in temperature and the effect these changes have on the optic signal generator or the driver.

Figure 14:
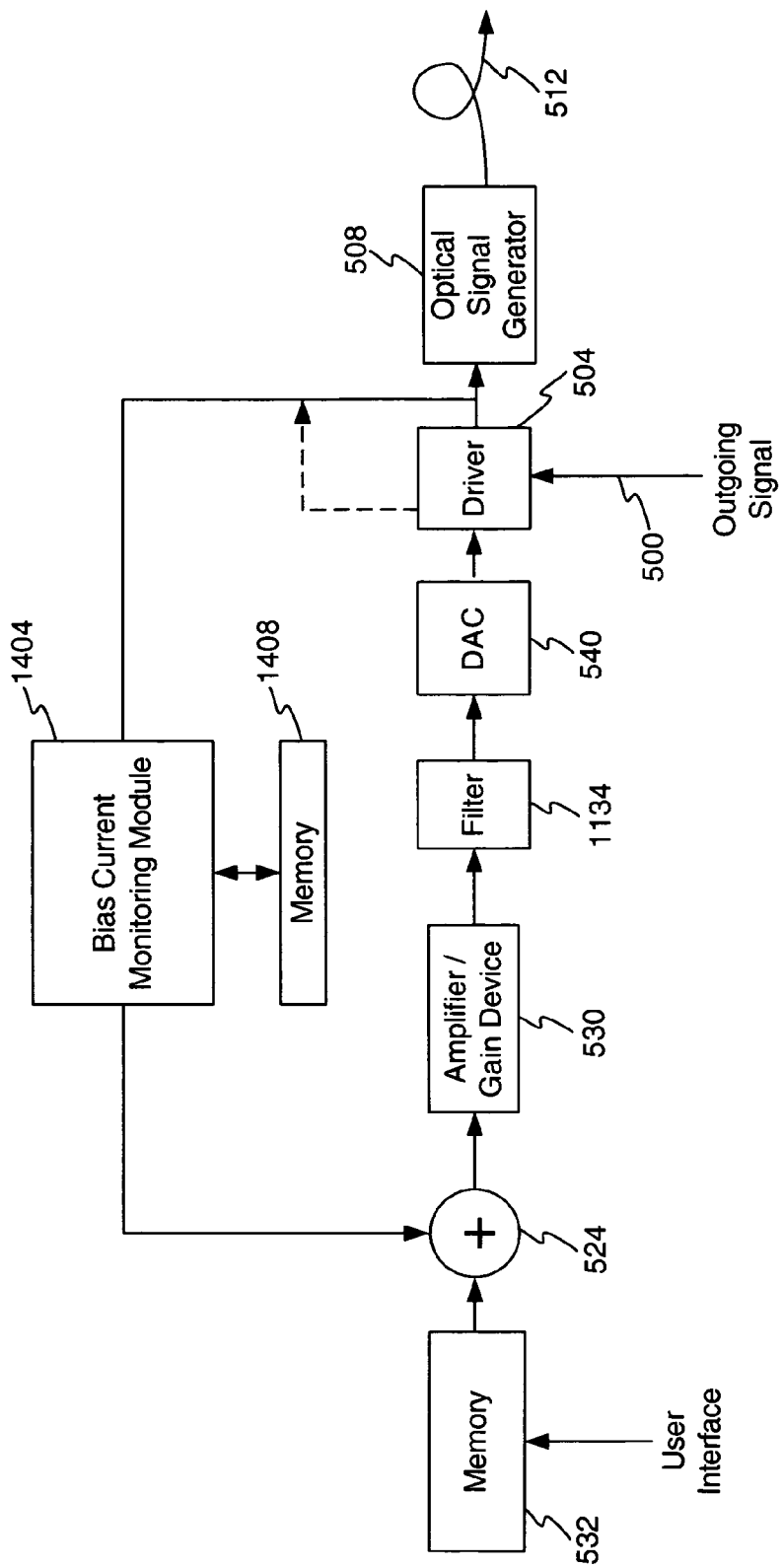
FIG. 14 illustrates a block diagram of an example embodiment of an optic signal modulation control system with a bias current feedback loop.

FIG. 14 illustrates a block diagram of an optic signal power control system utilizing bias current monitoring. This is but one possible example embodiment and, as such, it is contemplated that one of ordinary skill in the art may determine other embodiments or configuration that also monitor bias current, yet do not depart from the claims that follow. In general, any method of monitoring bias current may be utilized and the step or a system for detecting a current is generally understood, such as, through the use of peak detectors, comparators, A/D converters, trans-impedance amplifiers, current mirrors, as well as state machines used to control some or all of the aforementioned. As a result, the particular current detection system is not described in detail and the claims that follow are not limited to one particular type of current monitor.

In this embodiment, a bias current monitoring module 1404 connects to either the driver 504, one or more of the driver outputs as shown, or both. Via these connections, the bias current monitoring module 1404 receives the bias current value. Upon receipt of the bias current value, the bias current monitoring module 1404 is configured to process the bias current value to thereby generate a correction value, which may be output to the junction 524.

In one embodiment, the bias current monitoring module 1404 connects to a memory module 1408 or may communicate with memory 532. Either of the memories, or another memory, not shown, may store one or more threshold values to which the bias current value is compared. Based on this comparison, the correction value may be generated and provided to the junction 524. The comparison may occur using one or more comparators, control logics, or any HW/SW control module, and may occur in the analog or digital domain, any of which may be located in the module 1404. The difference between a threshold or optimum bias current value, that is stored in memory, and the actual bias current value may comprise the correction or compensation value, or may be used to retrieve a desired correction or compensation value that is stored in memory.

In one embodiment, the bias current monitoring module 1404 comprises processing capability configured to execute one or more equations. The equations may comprise any type equation selected to calculate a correction or compensation value based on the detected bias current value. In one embodiment, the equation comprises a polynomial configured compensate for optic signal power change and/or slope efficiency variations based on the detected bias current value.

It is further contemplated that numerous types of distortion may affect the signal during the generation or transmit processes. These types of distortion are generally undesired as it may cause the received signal to deviate from the signal that was transmitted. This in turn may lead to an inability for a receiver to accurately decode the received signal.

One exemplary type of unwanted distortion comprises multiplicative type distortion. The term multiplicative type distortion is defined to mean distortion that compresses or expands the magnitude of the signal levels. In contrast to additive type distortion, wherein the signal may be shifted upward or downward in magnitude, multiplicative distortion compresses or expands one or more signal output level. A signal may suffer from additive distortion, multiplicative distortion, or both. The output signal levels may be predefined signal levels, such as logic one values or logic zero values. It is further contemplated that the signal may have two or more signal levels, such as for example in a PAM type system or any other multilevel system. The term multilevel is defined to two or more signal magnitude or power levels. A multilevel signal system may be utilized in an optic environment to increase effective bandwidth. In one embodiment, different signal output levels are transmitted or differentiated at different optic signal intensity levels. With regard to the systems and methods described herein, it is contemplated that such systems or methods may be configured for operation in a two signal level environment or as part of a system which utilizes more than two signal levels. It is also contemplated that the method and system may be utilized or configured to compensate or correct any of the two or more signal levels.

Figure 15A:
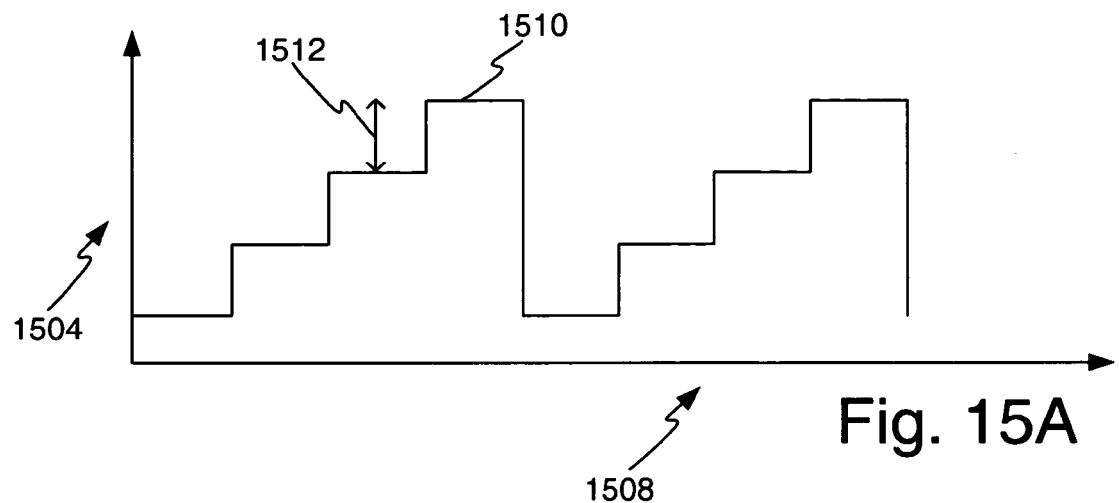
FIGS. 15A, 15B and 15C illustrate signal plots showing different levels of multiplicative distortion.
Figure 15B:
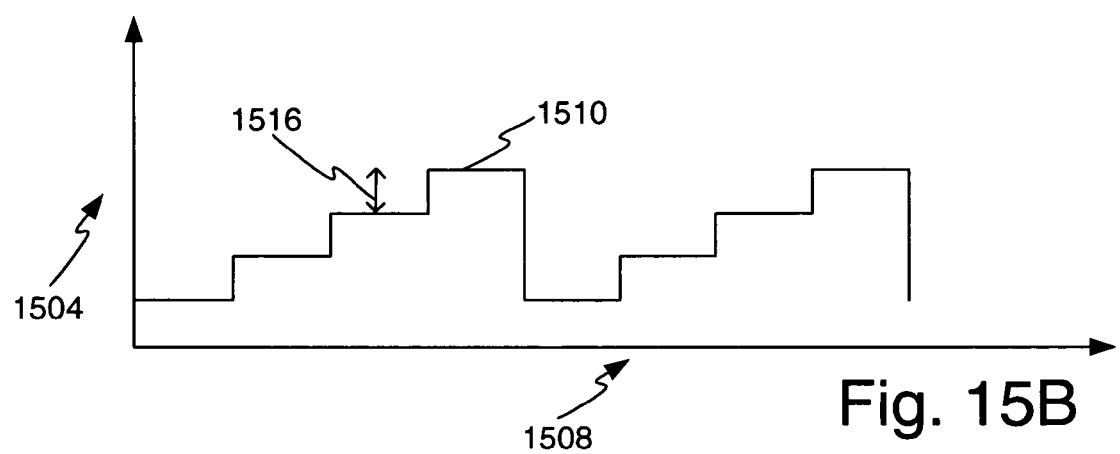
Figure 15C:
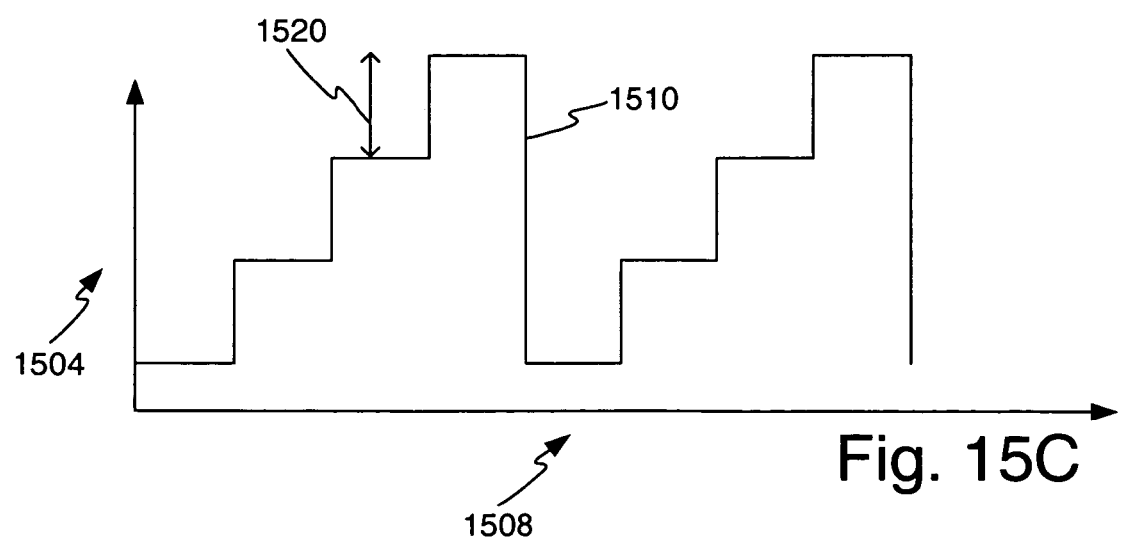

FIG. 15A-15C illustrates signal plots of multiplicative type of distortion. This is but one example signal plot and is provided for purposes of discussion and not limitation. Other signal plots or signal formats will be utilized by various other communication systems. In FIG. 15A, an undistorted signal is provided for reference. Magnitude is shown in the vertical axis 1504 while time is represented by the horizontal axis 1508. A difference, or step magnitude 1512, between signal levels exists to differentiate the signal levels.

FIG. 15B illustrates a compressed version of the signal 1510, such as a single that may be suffering from multiplicative distortion. As shown, the step magnitude 1516 is reduced or compressed as compared to the step magnitude 1512 shown in FIG. 15A. In contrast, FIG. 15C illustrates an example plot of a distorted signal 1510 suffering from expansion. The step magnitude 1520 is larger as compared to step magnitude 1512 shown in FIG. 15A.

Upon reception at a receiver of the signals shown in FIGS. 15B and 15C, it may be impossible to accurately complete the decode and process operation because the levels of the signals are different than expected. As a result, it may be desired to compensate for compression or expansion in the transmitter. It is also contemplated that the compensation processing may be performed in the receiver, such as by scaling the received signal to establish the step magnitudes to a desired level or changing one or more threshold levels, such as in a slicer.

Figure 16:
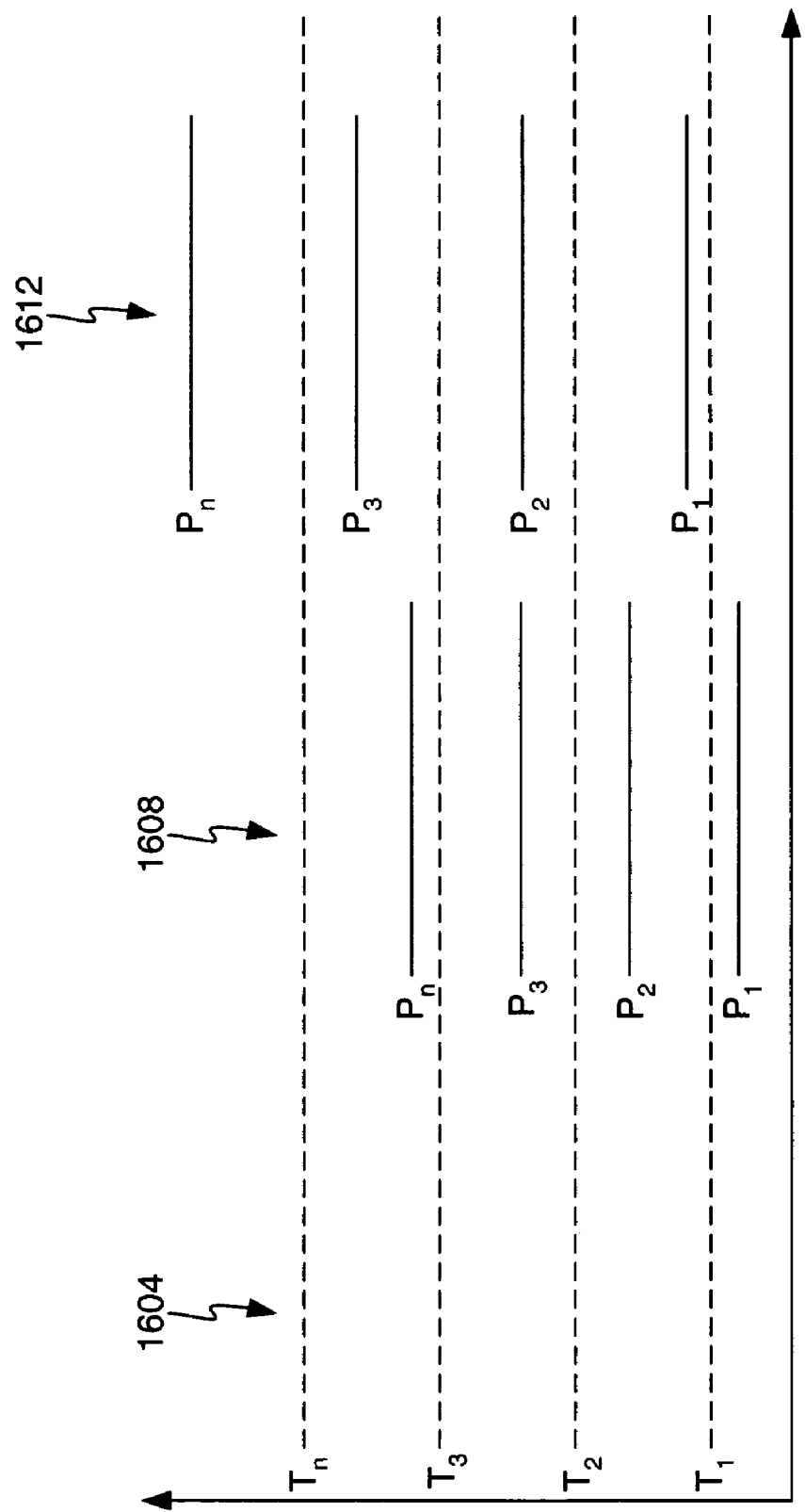
FIG. 16 illustrates threshold levels or signal levels.

FIG. 16 illustrates an example plot used for referenced during the following discussion. In this plot, four signal levels are shown although in other embodiments a different number of signal levels may be adopted. Target signal output levels 1604 are shown as $T_1$-$T_n$, where n is any whole number. In this embodiment the target values $T_1$-$T_n$ 1604 are the desired signal output levels for the various (4) signal levels. The signal power levels $P_1$-$P_n$ 1608 suffer however from compression and thus, are decreased in magnitude per corresponding levels and have a smaller step magnitude. In contrast, signal power levels $P_1$-$P_n$ 1612 are expanded thereby having a greater magnitude per level and have a larger step magnitude. It may be desired to compensate a signal, prior to transmission, or upon reception, to have the power levels of the outgoing signal or receive signal approach or mirror the desired target levels $T_1$-$T_n$ 1604.

Figure 17:
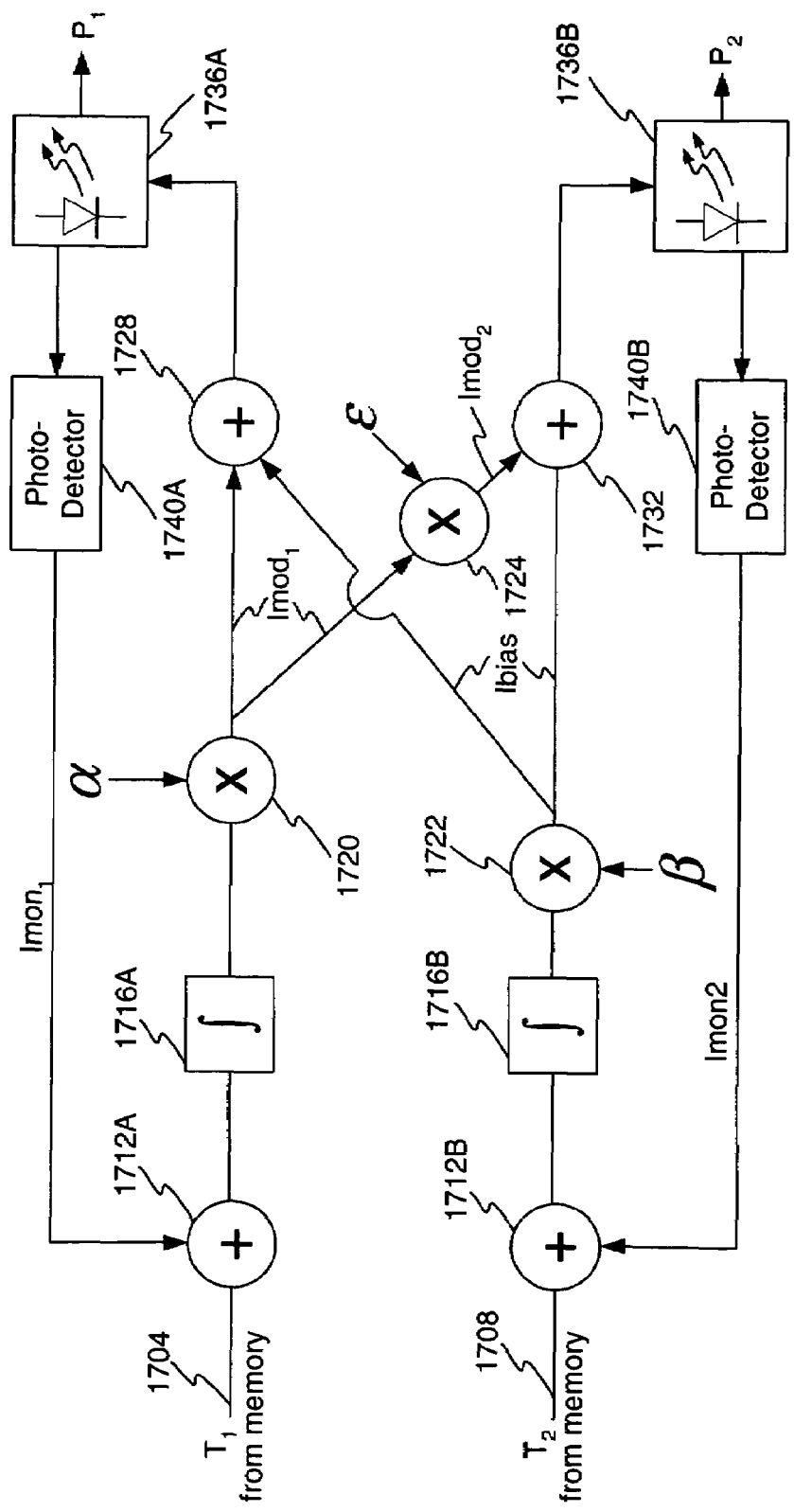
FIG. 17 illustrates a block diagram of an example embodiment of an optic signal power control system.

FIG. 17 illustrates a block diagram of an example embodiment of a distortion compensation system. This is but one example embodiment and as such it is contemplated that one of ordinary skill in the art may arrive at other systems or methods of processing after reading this disclosure. The example embodiment shown in FIG. 17 the values P1 and P2 are power levels that are be detected by photo detectors 1740A, 1740B, the output of which is then are feedback as currents to the adders 1712A, 1712B. The photo detectors 1740A, 1740B may be considered as or configured as power monitors. It is contemplated that power monitors or detectors 1740A, 1740B and the laser diodes may be one and the same acting on a different level of the signal at different times. The signal exiting 1716B may be considered Ibias, while the signal passing from 1720 to 1728 may be considered as Imod1. Likewise, the signal going from junction 1724 to junction 1732 may comprise Imod2. Additionally, the feedback signals going to adders 1712A and 1712B may be considered Imon1 and Imon2 as shown, and these signals may be used to compensate for multiplicative distortion, additive distortion, or both. This embodiment may be enabled in the digital domain, analog domain or a combination of both. Likewise, the system may comprise hardware, software, or a combination of both.

In this example embodiment, a first target value T1 is provided to the system on input 1704 while a second target value T2 is provided on input 1708. The target values may be stored in memory, calculated, or generated in any manner. The T1/P1 loop (upper loop) compensates for multiplicative distortion in both P1 and P2. The T2/P2 loop (lower loop) compensates for additive distortion in both P1 and P2. For example, the loop that feeds the multiplier epsilon, in this case T1/P1, may be configured to compensates for multiplicative distortion. The inputs 1704, 1708 connect to junctions 1712A, 1712B as shown. These junctions 1712A, 1712B also receive a feedback signal as shown, which is described in more detail below. The junctions 1712A, 1712B may comprise any device capable of combining, adding, or subtracting signals. The output of the junctions 1712A, 1712B connect to integrators 1716A, 1716B. In this embodiment the feedback blocks 1740A, 1740B comprise photo detectors that are used as power monitors.

In this embodiment the integrators 1716A, 1716B generate a running total of the input and provide this total as an output. Operation of an integrator is generally understood in the art and hence not described in detail herein.

The output of integrator 1716A connects to a multiplier 1720, which also receives a scaling factor, alpha ($\alpha$). The factor alpha ($\alpha$) is selected to set the bandwidth of the multiplicative loop. Note that multiplier 1720 could also be placed before the integrator or inside the integrator with no effect on the performance of the loop as the system is linear.

The output Imod1 of the multiplier 1720 is provided to a junction 1728 and a multiplier 1724. The junction 1728 combines, either through subtraction, addition, or other operation, the signal Imod1 from multiplier 1720 and the signal $I_{bias}$ from multiplier 1722 and provides the resulting signal to a laser diode 1736A, which generates output P1. The signal is then detected by the photo detector 1740A. In other embodiments, any other type of detector may be utilized including, but not limited to, a backscatter detector, an avalanche photo detector, or feedback from a receive channel setting. The multiplier 1724 also receives as an input a scaling factor epsilon ($\epsilon$) which modifies the input to the multiplier 1724 to generate output Imod2. The scaling factor $\epsilon$ is selected to couple the multiplicative control with the additive control for P2. In one embodiment, the value $\epsilon$ is defined as the ratio between Imod2 and Imod1, which effectively sets the ratio of power level P2 to power level P1. It also affects the bandwidth of the coupled loops together with alpha and beta. Imod1 and Ibias are added in junction 1728 and delivered to laser diode 1736A to generate the power level $P_1$. Imod2 and $I_{bias}$ are added in junction 1732 and delivered to laser diode 1736B to generate power level $P_2$, and are defined as set forth herein. Note that laser diodes 1736A and 1736B are generally the same device, with outputs Imod1 and Imod2 selected using a fast MUX or switch.

Turning now to the output of the integrator 1716B, a connection is provided to a multiplier 1722, which also receives a scaling factor, beta ($\beta$). The factor beta ($\beta$) is selected to set the bandwidth of the additive loop. Note that multiplier 1722 could also be placed before the integrator or inside the integrator with no effect on the performance of the loop as the system is linear. Multiplier 1722 provides a signal Ibias to junction 1728 and to the junction 1732. The junction 1732 combines, either through subtraction, addition, or other operation, the signal Imod2 from multiplier 1724 and the signal Ibias from multiplier 1722 and provides the resulting signal to a laser diode 1736B, which generates output P2. The signal is then detected by the photo detector 1740B. In other embodiments, any other type of detector may be utilized including, but not limited to, a backscatter detector, an avalanche photo detector, or feedback from a receive channel setting.

The photo detector monitors 1740A, 1740B are configured to monitor power and based on the signal power to modify the signal received from the respective junction 1728, 1732. The photo detector monitors 1740A, 1740B may comprise any type photo detector monitor. In one embodiment the monitors 1740A, 1740B comprise a PIN type photo detector. In other embodiments, other monitors, in addition to or instead of, may monitor one or more aspects of the circuit, performance, or environment. The data resulting from the monitoring may be used to control any aspect of the circuit operation or power control.

In this embodiment the output of the photo detector monitor 1740A is provided as a feedback signal to junction 1712A. The output of the photo detector monitor 1740A is also provided as an output, in this embodiment Imon1. In this embodiment the value Imon1 is proportional to the power level $P_1$ for at least one transmit power level in a multiple power level transmit environment. In this embodiment the output Imon1 may also be considered as the multiplicative component control variable or feedback monitor. Thus, in this embodiment, the value of Imon1, which may also be provided as a feedback signal, controls or compensates for the multiplicative component of noise/distortion.

The output of junction 1732 connects to photo detector monitor 1740B, which may be configured similarly to photo detector monitor 1740A as described above. The output Imon2 of the monitor 1740B is provided as a feedback signal to junction 1712B. The feedback signal is processed by junction 1712B in connection with the target value 1708. In this embodiment the output Imon2 is proportional to the power level $P_2$ for at least one transmit power level in a multiple power level transmit environment. In this embodiment the output Imon2 is considered as the additive component control variable or the feedback monitoring signal from additive noise/distortion. Thus, in this embodiment the value of Imon2, which is also provided as a feedback signal, controls or compensates for the additive component of noise/distortion.

In operation, the target values are provided to junctions 1704, 1708 and processed in connection with the feedback signals Imon1 and Imon2 respectively. In one embodiment the output of the junctions 1712A, 1712B may be considered error signals. The output of the junctions are integrated by elements 1716A, 1716B. The integrators 1716A, 1716B integrate the error signals derived from the summing junctions 1712A, 1712B. The output of integrator 1716A is scaled by a factor α at multiplier 1720 and the resulting output provided to junction 1728 and to multiplier 1724.

The output of integrator 1716B is scaled by a factor β at multiplier 1722 and the resulting output is also provided to junction 1728 and to junction 1732. The combined signal from 1728 is provided to the laser diode 1736A to generate signal P1 which then is provided to the photo detector 1740A, whose feedback signal which is provided to junction 1712A as an error or difference signal. The multiplicative noise/distortion compensation loop, shown at the top of FIG. 17, operates to maintain $P_1$ and $P_2$ at or near the same target values $T_1$ and $T_2$, together with the lower loop in FIG. 17.

Turning now to the lower loop shown in FIG. 17, the junction 1732 combines the output of the multiplier 1724, which is modified or scaled by ε, with the output of the multiplier 1722. The integrator 1716B serves to integrate the error signal the gain of the integrator 1716B is scaled by beta of multiplier 1722 and adjusts the bandwidth of the lower additive control tracking loop. The scaling factor ε serves to couple the multiplicative control signal from the top (multiplicative) loop to the additive loop and compensate both for multiplicative and additive distortion affecting P2. The output of the summing junction 1732 is provided to laser diode 1736B to generate P2 which is then monitored by the photo detector monitor 1740B. The output of the photo detector monitor 1740B is output as a current level value Imon2 and provided as a feedback signal to junction 1712B. The input to the junction 1712B may be considered an error signal. This loop attempts to establish $P_2$ and P1 at or near $T_2$ and T1, respectively, and compensate for multiplicative noise/distortion of both power levels.

The values $P_1$ and $P_2$ may be considered power levels for two of the transmit power levels which have been corrected or compensated for additive and multiplicative noise/distortion. It is contemplated that from these two compensated power levels, other or additional power levels may be arrived at or generated in a multi-power level transmit environment. For example, to compensate other power levels, the additive compensation provided to power level $P_1$ and/or $P_2$ may also be provided to the other power levels in the transmit environment. Similarly, with regard to multiplicative noise, the same or a similar multiplication or scaling factor may be applied to one or more of the other power levels in a multiple power level environment through the use of a different epsilon for each different power level. In each case epsilon(n)=Imod(n)/Imod1. The method and apparatus to enable applying appropriate scaling to other signal levels would be understood by one of ordinary skill in the art.

Alternatively, all or a portion of the structure shown in FIG. 17 may be duplicated or provided for the other power levels. Hence, each power level may be monitored in a feedback loop to compensate or correct for additive and multiplicative noise/distortion. The method and apparatus to enable applying appropriate scaling to other signal levels would be understood by one of ordinary skill in the art.

The advantage provided by the cross-coupled loop is that it provides a means to compensate multiple signals for multiplicative and additive distortion automatically and simultaneously through the monitoring of only two sample signals and therefore requires minimal hardware.

Figure 18:
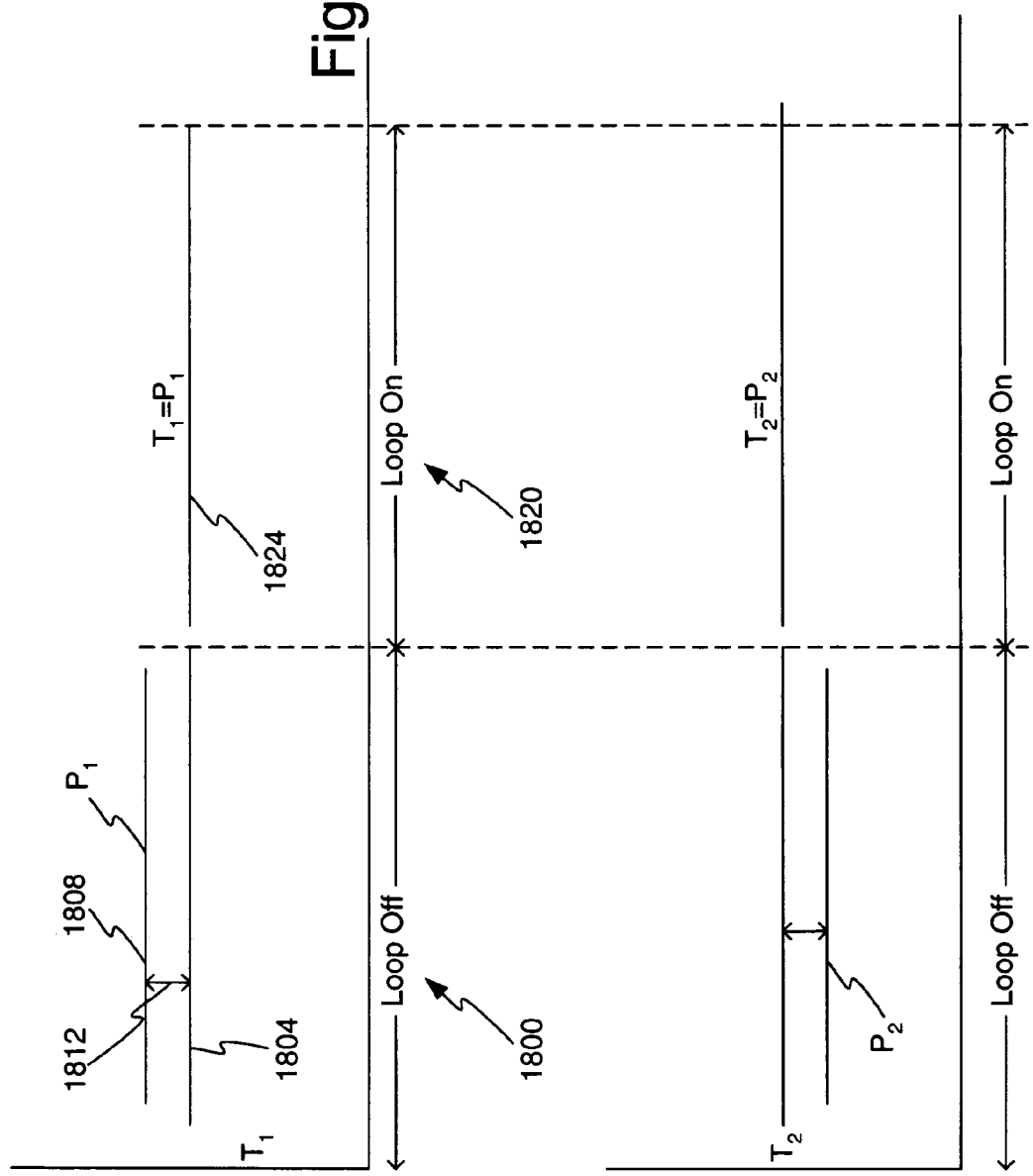
FIGS. 18A and 18B illustrate an example signal plot an optic signal before and after compensation.

FIG. 18 illustrates exemplary plots of power level and target value during loop operation. In other embodiments or methods of operation other plots may be generated. As shown in FIG. 18A, during a period 1800 when the compensation loop(s) are off, the target value $T_1$ 1804 is shown as is the actual power level $P_1$ 1808 of a transmitted signal. Although it is desired that the power level 1808 of the plot $P_1$ be at or near the target value 1804, during the loop off period, power level $P_1$ 1808 differs from the target level 1804 by a difference value 1812. This is generally undesirable and may be the result of additive and/or multiplicative noise.

During a loop on period 1820, the additive and multiplicative compensation loops are operational and the power level $P_1$ is the same or similar to the target value, both of which are shown by overlaid plots 1824. As a result, the output power level of the transmit signal is at or near the desired target level. This signal compensation may be expanded to other power levels, such as shown in FIG. 18B for power level $P_2$ and target $T_2$. Signal plots in FIG. 18B are generally similar to the plots in FIG. 18A and hence are not described in detail.

Figure 19:
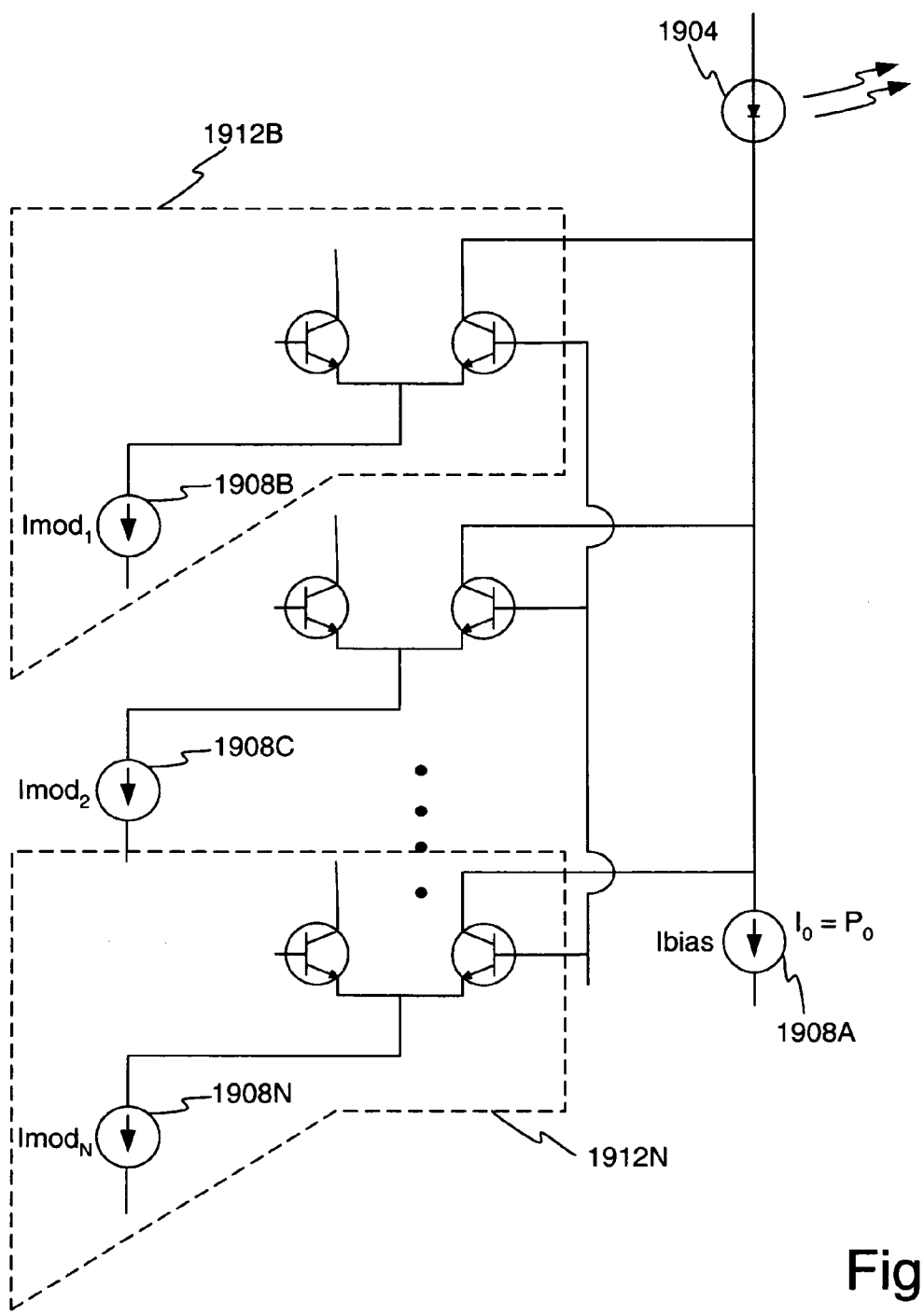
FIG. 19 illustrates a circuit level diagram of an example embodiment of the invention.

FIG. 19 illustrates an example embodiment of a circuit level example embodiment of a multiple power level generator. This example embodiment illustrates one circuit for generating multiple output power levels. An optic signal generator 1904 is configured to generate an output signal based on a current flow through the generator or circuit. The optic signal generator 1904 may comprise any element or device capable of generating an optic signal. In this embodiment a current source 1908A generates a current flow corresponding to a power level $P_0$. The power level $P_0$, or other power levels may represent optic signal power levels.

Also shown in the circuit of FIG. 19 is one or more power level control blocks 1912 as shown. These power level control blocks may be selectively utilized to modify the power level of the output signal. In the blocks 1912, current sources 1908 are provided as shown. Any number N of blocks 1912 may be provided, which may be related to the number of power levels in use. The value for N may comprise any whole number.

In one embodiment the following equations define operation of the system shown in FIG. 17, although in other embodiment, other different equations or relationships may exist. The values $P_1$ and $P_2$ may be defined as follows:

$$I_1 = I\text{mod}_1 + I\text{bias, and}$$

$$I_2 = I\text{mod}_2 + I\text{bias}$$

Also:

$$P_1 = \eta(t)[I_1 - i_{th}(t)], \text{ and}$$

$$P_2 = \eta(t)[I_2 - i_{th}(t)]$$

This may then expand to:

$$P_1 = \eta(t)[I\text{mod}_1 + I\text{bias} - i_{th}(t)]$$

$$P_2 = \eta(t)[I\text{mod}_2 + I\text{bias} - i_{th}(t)]$$

Where $\eta$ is the efficiency of the system. Furthermore, if Ibias=$i_{th}(t)$, and Imod2=Imod1*epsilon then $$P_1 = \eta(t)[I\text{mod}_1]$$

$$P_2 = \eta(t)[I\text{mod}_1 * \text{epsilon}]$$

If Imod1=P1/$\eta$(t), and P2=P1*epsilon then $P_1 = P_1$ and $P_2 = P_2$.

Expanding this to multiple channels, where n or N may comprise any whole number, it can be shown that by processing $P_1$ and $P_2$, other current values or power levels may be obtained.

$$I_1 = \alpha P_1 + \beta$$

$$I_2 = \alpha P_2 + \beta$$

$$I_3 = \alpha P_3 + \beta$$

$$I_4 = \alpha P_4 + \beta$$

$$I_n = \alpha P_n + \beta$$

While various embodiments of the invention have been described, it will be apparent to those of ordinary skill in the art that many more embodiments and implementations are possible that are within the scope of this invention. In addition the various components may be combined or enabled alone, or in any combination.

What is claimed is:

1. An optic signal control system for use in a communication device comprising:
   a memory configured to store one or more target values;
   a driver configured to process an outgoing signal based two or more drive control signals;
   an optic signal generator configured to generate an optic signal representative of the outgoing signal based on the one or more target values, the one or more feedback values, or both; and
   a detector configured to monitor at least the power level of the optic signal and generate two or more feedback signals;
   one or more junctions configured to calculate the difference between the one or more target values and the two or more feedback signals to generate two or more error signals;
   two or more multipliers configured scale the two or more error signals to create two or more scaled error signals;
   cross connect junctions configured to combine the two or more scaled error signals to create two or more drive control signals.

2. The system of claim 1, further comprising one or more junctions configured to combine the two or more feedback signals with the one or more target values comprise summing junctions.

3. The system of claim 1, wherein the optic signal comprises three or more different intensity levels, one or more of which are affected by additive noise/distortion and multiplicative noise/distortion.

4. The system of claim 1, further comprising one or more integrators configured to provide first order control, wherein the two or more error signals are provided as inputs to the one or more integrators.

5. The system of claim 1, wherein the two or more drive control signals are configured to control one or more of the following parameters: driver bias current, driver modulation current, and/or directly and/or indirectly optic signal extinction ratio, and optic signal power.

6. The system of claim 1, further comprising scaling multiplier as part of the cross connect junctions.

7. A method for controlling two or more power levels of an optic signal generated by an optic signal module using two or more feedback signal to thereby compensate for multiplicative distortion comprising:
   monitoring the optic signal;
   detecting a power level of the optic signal;
   generating two or more feedback signals resulting from the detected the power level from the monitored optical signal;
   comparing the two or more feedback signals to two or more target values to generate two or more error signals;
   processing the two or more error signals to generate two or more scaled signals;
   cross coupling the two or more scaled signals to generate power control signal for use by the optic signal module to control power levels of an optic signal wherein at least one of the two or more scaled signals compensates for multiplicative distortion.

8. The method of claim 7, wherein processing the two or more error signals comprises multiplying by a scaling.

9. The method of claim 7, wherein the one or more aspects of the optical signal which are monitored comprise power or an effect of temperature on the power of the optic signal.

10. The method of claim 7, wherein the detecting is performed by an optical detector.

11. The method of claim 7, wherein the detecting is performed by a photodiode.

12. The method of claim 7, wherein the one or more target values are in a digital format and the two or more feedback values are in an analog format and the method further comprises converting the one or more target values from a digital format to an analog format.

13. The method of claim 7, wherein the optic signal may comprise three or more intensity levels and the two or more feedback levels are utilized to control the optic signal at the three or more intensity levels.

14. A method for compensating for additive noise/distortion and multiplicative noise/distortion in an optic communication device producing an optic signal having multiple power levels, the method comprising:

receiving a target value from a memory for a first power level;

generating an feedback signal by monitoring a power level the optic signal at the first power level;

comparing a target value to the feedback value to generate an error signal from the first power level;

performing scaling on the error signal and an integrated version of the error signal to generate a scaled control signal;

cross coupling the scaled control signal from the first power level with a control signal from a second power level and performing scaling on one or both of the control signals from the first power level and the control signal from the second power level to create one or more coupled power control signals, wherein the coupled power control signals are configured to control the power level of the optic signal.

15. The method of claim 14, wherein the power control signal is based on the feedback value.

16. The method of claim 14, further comprising monitoring temperature of the communication device and adjusting the power level, the feedback signal, or both based on the monitoring.

17. The method of claim 14, further comprising determining an additive compensation value and a multiplicative compensation value for a first power level and applying the additive compensation value and a multiplicative compensation value to the first power level.

18. The method of claim 14, wherein the optic communication system utilizes three or more optic signal power levels.

19. The method of claim 18, wherein the coupled power control signal, the feedback value, or the error signal is utilized to compensate the power levels for the three or more optic signal power levels.

20. The method of claim 13, further comprising monitoring temperature optic signal power level, as part of generating the error signal or the feedback value.

* * * * *